United States Patent
Hwang et al.

(10) Patent No.: US 12,165,571 B2
(45) Date of Patent: Dec. 10, 2024

(54) DRIVING CIRCUIT BOARD, ELECTRONIC APPARATUS INCLUDING DRIVING CIRCUIT BOARD, AND METHOD OF FABRICATING ELECTRONIC APPARATUS

(71) Applicants: SAMSUNG ELECTRONICS CO., LTD., Suwon-si (KR); FOUNDATION OF SOONGSIL UNIVERSITY-INDUSTRY COOPERATION, Seoul (KR)

(72) Inventors: Junsik Hwang, Suwon-si (KR); Geonwook Yoo, Seoul (KR); Hojin Lee, Seoul (KR); Yongchan Kim, Seoul (KR); Kyungwook Hwang, Suwon-si (KR)

(73) Assignees: SAMSUNG ELECTRONICS CO., LTD., Suwon-si (KR); FOUNDATION OF SOONGSIL UNIVERSITY-INDUSTRY COOPERATION, Seoul (KR)

( * ) Notice: Subject to any disclaimer, the term of this patent is extended or adjusted under 35 U.S.C. 154(b) by 73 days.

(21) Appl. No.: 18/085,162

(22) Filed: Dec. 20, 2022

(65) Prior Publication Data
US 2023/0377509 A1    Nov. 23, 2023

(30) Foreign Application Priority Data
May 20, 2022    (KR) .......................... 10-2022-0062339

(51) Int. Cl.
*G09G 3/32*        (2016.01)

(52) U.S. Cl.
CPC ....... *G09G 3/32* (2013.01); *G09G 2300/0426* (2013.01); *G09G 2310/0275* (2013.01)

(58) Field of Classification Search
CPC ............. G09G 3/32; G09G 2300/0426; G09G 2310/0275; G09G 2300/08; H05K 3/303;
(Continued)

(56) References Cited

U.S. PATENT DOCUMENTS 8,035,588 B2 * 10/2011 Pan ...................... G09G 3/3659
                                                                   345/87
9,172,020 B2   10/2015 Kim et al.
(Continued)

FOREIGN PATENT DOCUMENTS

| CN | 109003966 B | 10/2020 |
| CN | 110034218 B | 3/2021 |
| KR | 10-2013-0046335 A | 5/2013 |

OTHER PUBLICATIONS

Communication issued on Oct. 20, 2023 by the European Patent Office for European Patent Application No. 22210772.4.
(Continued)

*Primary Examiner* — Andrew Sasinowski
(74) *Attorney, Agent, or Firm* — Sughrue Mion, PLLC

(57) ABSTRACT

A driving circuit board includes a driving circuit board includes: a plurality of driving electrode regions on a surface of the driving circuit board; a plurality of driving electrodes symmetrically arranged on the plurality of driving electrode regions; and a driving circuit electrically connected to at least one of the plurality of driving electrodes, wherein the plurality of driving electrodes include at least one dummy electrode that is not connected to the driving circuit.

26 Claims, 23 Drawing Sheets

(58) Field of Classification Search
CPC .......... H05K 2201/09781; H05K 2201/10106; H05K 1/111; H01L 27/124; H01L 25/162; H01L 25/167; H01L 33/005; H01L 33/62; H01L 2933/0066; H01L 33/38
See application file for complete search history.

(56) References Cited

U.S. PATENT DOCUMENTS

| | | | |
|---|---|---|---|
| 9,240,145 | B2 | 1/2016 | Ichioka et al. |
| 9,466,765 | B1 * | 10/2016 | Yoon ............... H01L 33/62 |
| 10,115,862 | B2 | 10/2018 | Zhan et al. |
| 10,211,364 | B2 | 2/2019 | Schuele et al. |
| 10,243,097 | B2 | 3/2019 | Yuen |
| 10,418,527 | B2 | 9/2019 | Sasaki et al. |
| 10,930,819 | B2 | 2/2021 | Sasaki et al. |
| 2009/0321750 | A1 * | 12/2009 | Namioka ............. H01L 33/486 |
| | | | 257/E33.056 |
| 2012/0049351 | A1 | 3/2012 | Lee |
| 2013/0105851 | A1 | 5/2013 | Kim et al. |
| 2017/0358716 | A1 * | 12/2017 | Park ............... H01L 33/486 |
| 2020/0152826 | A1 | 5/2020 | Lee et al. |
| 2020/0168663 | A1 | 5/2020 | Choi et al. |
| 2021/0091257 | A1 | 3/2021 | Hwang et al. |
| 2021/0119079 | A1 | 4/2021 | Hwang et al. |
| 2021/0397045 | A1 | 12/2021 | Hwang et al. |
| 2022/0013400 | A1 | 1/2022 | Hwang et al. |
| 2022/0029046 | A1 | 1/2022 | Hong et al. |
| 2022/0102602 | A1 | 3/2022 | Hwang et al. |
| 2022/0139887 | A1 * | 5/2022 | Kim ............... H01L 25/167 |
| | | | 257/89 |
| 2022/0189810 | A1 | 6/2022 | Hwang et al. |
| 2022/0190223 | A1 | 6/2022 | Hwang et al. |
| 2022/0285188 | A1 | 9/2022 | Kim et al. |
| 2023/0400604 | A1 | 12/2023 | Hwang et al. |

OTHER PUBLICATIONS

Communication issued on Dec. 14, 2023 by the Korean Intellectual Property Office for Korean Patent Application No. 10-2022-0062339.

* cited by examiner

DRIVING CIRCUIT BOARD, ELECTRONIC APPARATUS INCLUDING DRIVING CIRCUIT BOARD, AND METHOD OF FABRICATING ELECTRONIC APPARATUS

CROSS-REFERENCE TO RELATED APPLICATION

This application is based on and claims priority under 35 U.S.C. § 119 to Korean Patent Application No. 10-2022-0062339, filed on May 20, 2022, in the Korean Intellectual Property Office, the disclosure of which is incorporated by reference herein in its entirety.

BACKGROUND

1. Field

The disclosure relates to a driving circuit board, an electronic apparatus including the driving circuit board, and a method of manufacturing the electronic apparatus, and more particularly, to a structure of an electrode formed on the driving circuit board.

2. Description of the Related Art

Light-emitting diodes (LEDs) have advantages over other light sources in that LEDs use low power and are eco-friendly. Because of these advantages, industrial demand for LEDs is increasing. LEDs are applied not only to lighting devices or an LCD backlights, but also to LED display devices. That is, display devices using micro-LEDs are being developed.

In manufacturing a display device including micro-LEDs, it is necessary to transfer the micro-LEDs to a driving circuit board. A pick and place method is widely used as a method of transferring a micro-LED to a driving circuit board. However, in this method, productivity may decrease as the size of the micro-LED decreases and the size of the display device increases. Moreover, transferring a micro-LED emitting multiple colors of light takes a lot of time to transfer because it requires as many transfer processes as the number of colors.

In addition, as the area of the display device increases, the area of the driving circuit board to which the micro-LED is to be transferred increases. In order to form a large-area display device, if the transfer process of the micro-LED is further increased, more time and costs may be incurred in manufacturing the display device. Accordingly, there is a need for a method of efficiently transferring micro-LEDs to a driving circuit board.

As a method of transferring a micro-LED to a driving circuit board, various wet and dry transfer techniques are known. For example, a wet transfer technique that uses the surface tension of a liquid to transfer a micro-LED to a desired position on a drive circuit board, a wet transfer technique using laminar flow caused by perturbation through, for example, solution pumping, and a dry transfer technique of transferring a micro-LED to a desired position on a driving circuit board using an ultrasonic vibrator, vibration of a diaphragm, or using an electric field or a magnetic field, are known.

When a plurality of micro-LEDs are transferred onto a driving circuit board including a driving electrode and a driving circuit using various wet and dry transfer techniques, pad electrodes formed on the plurality of micro-LEDs and driving electrodes formed on the driving circuit board are to be connected to each other. In this case, due to an alignment error of the plurality of micro-LEDs with respect to the driving circuit board, the pad electrodes and the driving electrodes corresponding to each other may not be connected to each other in the transfer process. For example, the first pad electrode may not be connected to the first driving electrode corresponding thereto, but may be connected to the second driving electrode corresponding to the second pad electrode. If the pad electrodes and the driving electrodes corresponding to each other are not connected with respect to some of the plurality of micro-LEDs, the performance of the display device may be degraded.

SUMMARY

Example embodiments provide a driving circuit board including driving electrodes having a structure which may be efficiently connected to pad electrodes of a plurality of electronic devices when the plurality of electronic devices are arranged on a driving circuit board, an electronic apparatus including the driving circuit board, and a method of manufacturing the electronic apparatus.

Additional aspects will be set forth in part in the description which follows and, in part, will be apparent from the description, or may be learned by practice of the presented embodiments of the disclosure.

According to an aspect of an example embodiment, a driving circuit board includes: a plurality of driving electrode regions on a surface of the driving circuit board; a plurality of driving electrodes symmetrically arranged on the plurality of driving electrode regions; and a driving circuit electrically connected to at least one of the plurality of driving electrodes, wherein the plurality of driving electrodes include at least one dummy electrode that is not connected to the driving circuit.

Each of the plurality of driving electrode regions includes a first sub-driving electrode region and a second sub-driving electrode region that is different from the first sub-driving electrode region, and the plurality of driving electrodes may further include a first driving electrode provided in the first sub-driving electrode region and a second driving electrode provided in the second sub-driving electrode region and electrically disconnected to the first driving electrode.

The first sub-driving electrode region may be a central region of each of the plurality of driving electrode regions, and the second sub-driving electrode region may surround the first sub-driving electrode region.

The second driving electrode may include at least one first sub-driving electrode and at least one first dummy electrode that are spaced apart from each other.

The at least one first sub-driving electrode may be electrically connected to the driving circuit, and the at least one first dummy electrode may be electrically disconnected with respect to the at least one first sub-driving electrode.

Each of the plurality of driving electrode regions further may include a third sub-driving electrode region that is different from the first sub-driving electrode region and the second sub-driving electrode region, and the plurality of driving electrodes further include a third driving electrode provided in the third sub-driving electrode region and electrically disconnected with respect to the first driving electrode and the second driving electrode.

The first sub-driving electrode region may be a central region of each of the plurality of driving electrode regions, the second sub-driving electrode region may surround the first sub-driving electrode region, and the third sub-driving electrode region may surround the second sub-driving electrode region.

The second driving electrode may include at least one first sub-driving electrode and at least one first dummy electrode that are spaced apart from each other, and the third driving electrode may include at least one second sub-driving electrode and at least one second dummy electrode that are spaced apart from each other.

The at least one first sub-driving electrode may be electrically connected to the driving circuit, and the at least one first dummy electrode may be electrically disconnected with respect to the at least one first sub-driving electrode, and the at least one second sub-driving electrode may include at least two second sub-driving electrodes that are electrically connected to each other, and the at least one second dummy electrode may be electrically disconnected with respect to the at least two second sub-driving electrodes.

According to an aspect of an example embodiment, an electronic apparatus includes: a driving circuit board including: a plurality of driving electrode regions on a first surface of the driving circuit board; a plurality of driving electrodes symmetrically arranged in the plurality of driving electrode regions; and a driving circuit electrically connected to at least one of the plurality of driving electrodes; and at least one electronic device provided on the driving circuit board and including a plurality of pad electrodes symmetrically arranged on a second surface of the electronic device to respectively face the plurality of driving electrodes in the plurality of driving electrode regions on the first surface of the driving circuit board, wherein the plurality of driving electrodes include at least one dummy electrode that is not connected to the driving circuit.

Each of the plurality of driving electrode regions may include a first sub-driving electrode region and a second sub-driving electrode region that is different from the first sub-driving electrode region, the plurality of driving electrodes may further include a first driving electrode provided on the first sub-driving electrode region and a second driving electrode provided on the second sub-driving electrode region and electrically disconnected to the first driving electrode, the electronic device may further include a first pad region and a second pad region on the second surface of the electronic device, and the second pad region is different from the first pad region, and the plurality of pad electrodes include a first pad electrode provided in the first pad region and a second pad electrode provided in the second pad region and electrically disconnected to the first pad electrode.

The first sub-driving electrode region and the second sub-driving electrode region may be arranged to correspond to the first pad region and the second pad region, respectively.

The first sub-driving electrode region may be a central region of each of the plurality of driving electrode regions, and the second sub-driving electrode region may surround the first sub-driving electrode region, and the first pad region may be a central region of the second surface of the electronic device, and the second pad region may surround the first pad region.

The second driving electrode may include at least one first sub-driving electrode and at least one first dummy electrode that are spaced apart from each other, and the second pad electrode may include at least two first sub-pad electrodes that are spaced apart from each other.

The at least one first sub-driving electrode may be electrically connected to the driving circuit, and the at least one first dummy electrode may be electrically disconnected with respect to the at least one first sub-driving electrode.

The at least two first sub-pad electrodes may be electrically connected to the at least one first sub-driving electrode and the at least one first dummy electrode.

Each of the plurality of driving electrode regions may further include a third sub-driving electrode region that may be different from the first sub-driving electrode region and the second sub-driving electrode region, the plurality of driving electrodes further include a third driving electrode provided in the third sub-driving electrode region and electrically disconnected with respect to the first driving electrode and the second driving electrode, the electronic device may further include a third pad region on the second surface of the electronic device, the third pad region being different from the first pad region and the second pad region, and the plurality of pad electrodes further include a third pad electrode which may be provided in the third pad region and may be electrically disconnected with respect to the first pad electrode and the second pad electrode.

The first sub-driving electrode region, the second sub-driving electrode region, and the third sub-driving electrode region may be arranged to correspond to the first pad region, the second pad region, and the third pad region, respectively.

The first sub-driving electrode region may be a central region of each of the plurality of driving electrode regions, the second sub-driving electrode region may surround the first sub-driving electrode region, and the third sub-driving electrode region may surround the second sub-driving electrode region, and the first pad region may be a central region of the second surface, the second pad region may surround the first pad region, and the third pad region may surround the second pad region.

The second driving electrode may include at least one first sub-driving electrode and at least one first dummy electrode that are spaced apart from each other, the second pad electrode may include at least two first sub-pad electrodes that are spaced apart from each other in the second pad region, the third driving electrode may include at least one second sub-driving electrode and at least one second dummy electrode that are spaced apart from each other, and the third pad electrode may include at least two second sub-pad electrodes that are spaced apart from each other in the third pad region.

The driving circuit may include a first driving circuit and a second driving circuit, the at least one first sub-driving electrode may be electrically connected to the first driving circuit, and the at least one first dummy electrode may be electrically disconnected with respect to the at least one first sub-driving electrode, and the at least one second sub-driving electrode may be electrically connected to the second driving circuit, and the at least one second dummy electrode may be electrically disconnected with respect to the at least one second sub-driving electrode.

The at least two first sub-pad electrodes may be electrically connected to the at least one first sub-driving electrode and the at least one first dummy electrode, and the at least two second sub-pad electrodes are electrically connected to the at least one second sub-driving electrode and the at least one second dummy electrode.

The electronic device may include a first conductive semiconductor layer, an active layer provided on the first conductive semiconductor layer, a second conductive semiconductor layer provided on the active layer, and the plurality of pad electrodes provided on the second conductive semiconductor layer.

The electronic device may include a first conductive semiconductor layer, an active layer provided on the first conductive semiconductor layer, a second conductive semiconductor layer provided on the active layer, a thin-film transistor layer provided on the second conductive semiconductor layer, and a light-emitting diode including the plurality of pad electrodes and provided on the thin-film transistor layer.

The second pad electrode may have a ring shape and surround the first pad electrode.

According to an aspect of an example embodiment, a method of manufacturing an electronic apparatus, the method includes: preparing a first substrate having a first upper surface in which a plurality of grooves are formed; supplying a plurality of light-emitting devices on the first upper surface of the first substrate; aligning the plurality of light-emitting devices in the plurality of grooves; preparing a second substrate including a second upper surface having a plurality of driving electrode regions corresponding to the plurality of grooves of the first substrate, a plurality of driving electrodes symmetrically arranged on the plurality of driving electrode regions of the second upper surface, and a driving circuit electrically connected to at least one of the plurality of driving electrodes; arranging the first substrate and the second substrate such that the plurality of grooves of the first substrate and the plurality of driving electrode regions of the second substrate face each other; and bonding the plurality of light-emitting devices aligned in the plurality of grooves and the plurality of driving electrodes, wherein each of the plurality of light-emitting devices includes a plurality of pad electrodes each including a first surface and a second surface facing each other, the plurality of pad electrodes being symmetrically arranged to correspond to the plurality of driving electrodes on the first surface facing each of the plurality of driving electrode regions, respectively, and wherein the plurality of driving electrodes include at least one dummy electrode that is not connected to the driving circuit.

The aligning the plurality of light-emitting devices in the plurality of grooves may include aligning the plurality of light-emitting devices in the plurality of grooves such that the plurality of pad electrodes of the plurality of light-emitting devices face upper openings of the plurality of grooves.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
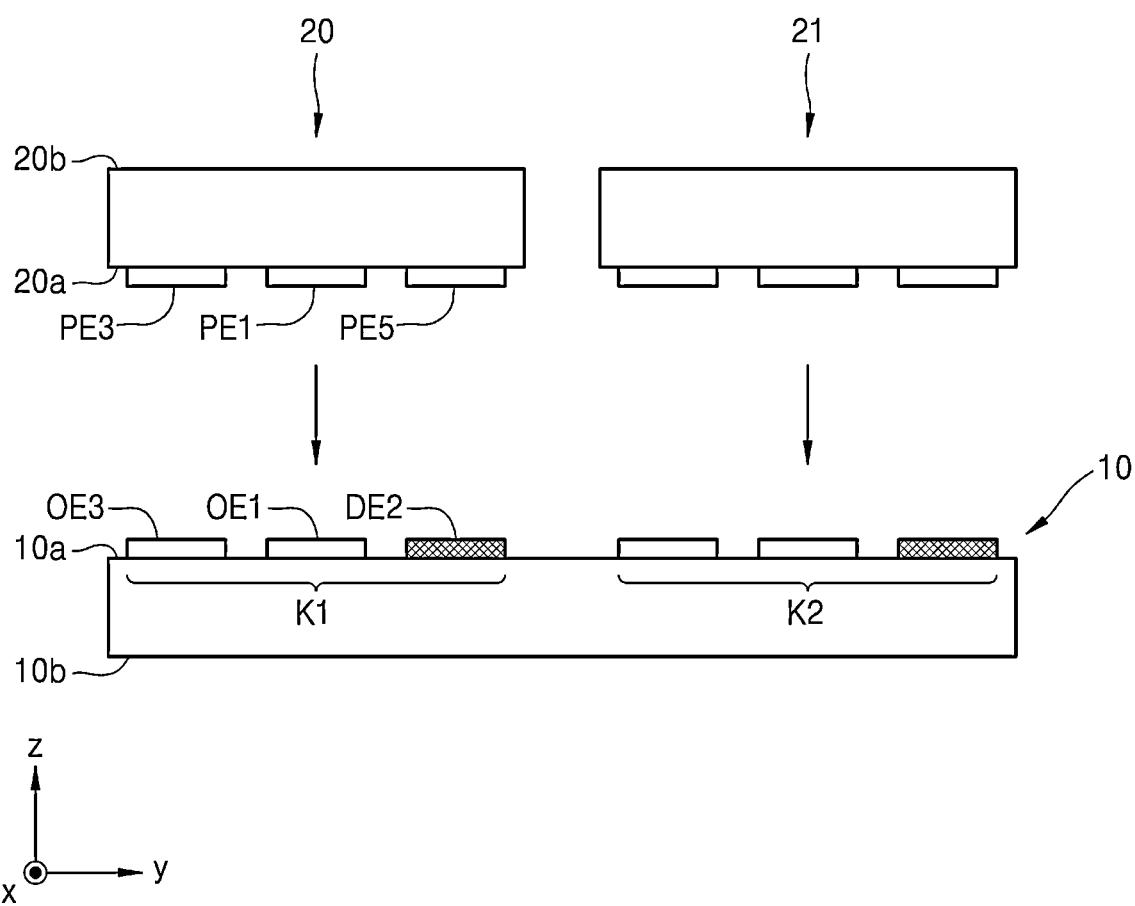
FIG. 1 is a view illustrating a state in which a plurality of electronic devices are transferred onto a driving circuit board according to a method of manufacturing an electronic apparatus, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, example embodiments will be described in detail with reference to the accompanying drawings. In the following drawings, the same reference numerals refer to the same components, and the size of each component in the drawings may be exaggerated for clarity and convenience of description. The embodiments described below are merely exemplary and various modifications are possible from these embodiments.

Hereinafter, the term "upper portion" or "on" may also include "to be present above on a non-contact basis" as well as "to be on the top portion in directly contact with". The singular expression includes plural expressions unless the context clearly implies otherwise. In addition, when a part "includes" a component, this means that it may further include other components, not excluding other components unless otherwise opposed.

The use of the term "the" and similar indicative terms may correspond to both singular and plural. The use of all examples or exemplary terms is merely for describing a technical idea in detail and the scope is not limited to the examples or exemplary terms unless limited by the claims.

The terms first, second, etc. may be used to describe various components, but the components should not be limited by terms. Terms are used only to distinguish one component from another.

Further, the terms "unit", "module" or the like mean a unit that processes at least one function or operation, which may be implemented in hardware or software or implemented in a combination of hardware and software.

The specific executions described in this embodiment are examples, and do not limit the technical scope in any way. For the simplicity of the specification, the description of conventional electronic configurations, control systems, software, and other functional aspects of the systems may be omitted. in addition, the connection or connection members of lines between the components shown in the drawings exemplarily represent functional connection and/or physical or circuit connections, and may be replaceable or represented as various additional functional connections, physical connections, or circuit connections in an actual device.

Steps constituting the method may be performed in an appropriate order unless there is a clear statement that the steps should be performed in the order described. In addition, the use of all illustrative terms (e.g., etc.) is simply intended to detail technical ideas and, unless limited by the claims, the scope of rights is not limited due to the terms.

Figure 2:
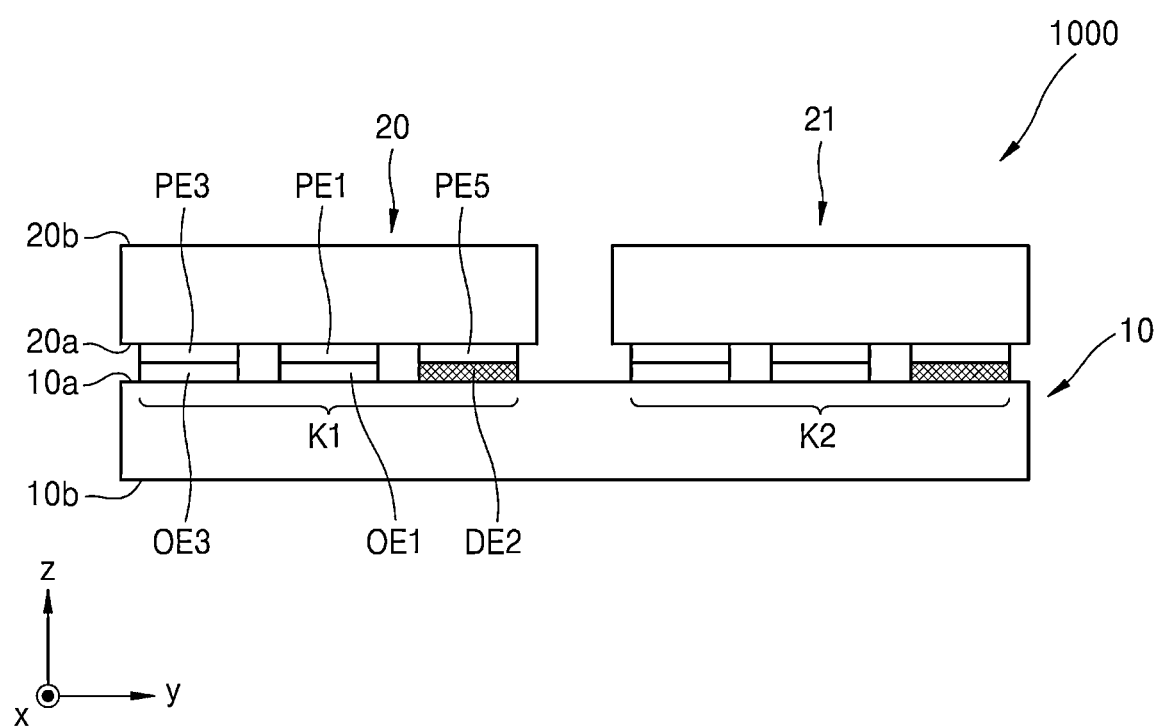
FIG. 2 illustrates an example structure of an electronic apparatus including a structure in which a plurality of electronic devices and a driving circuit board are connected, according to an embodiment.
Figure 3:
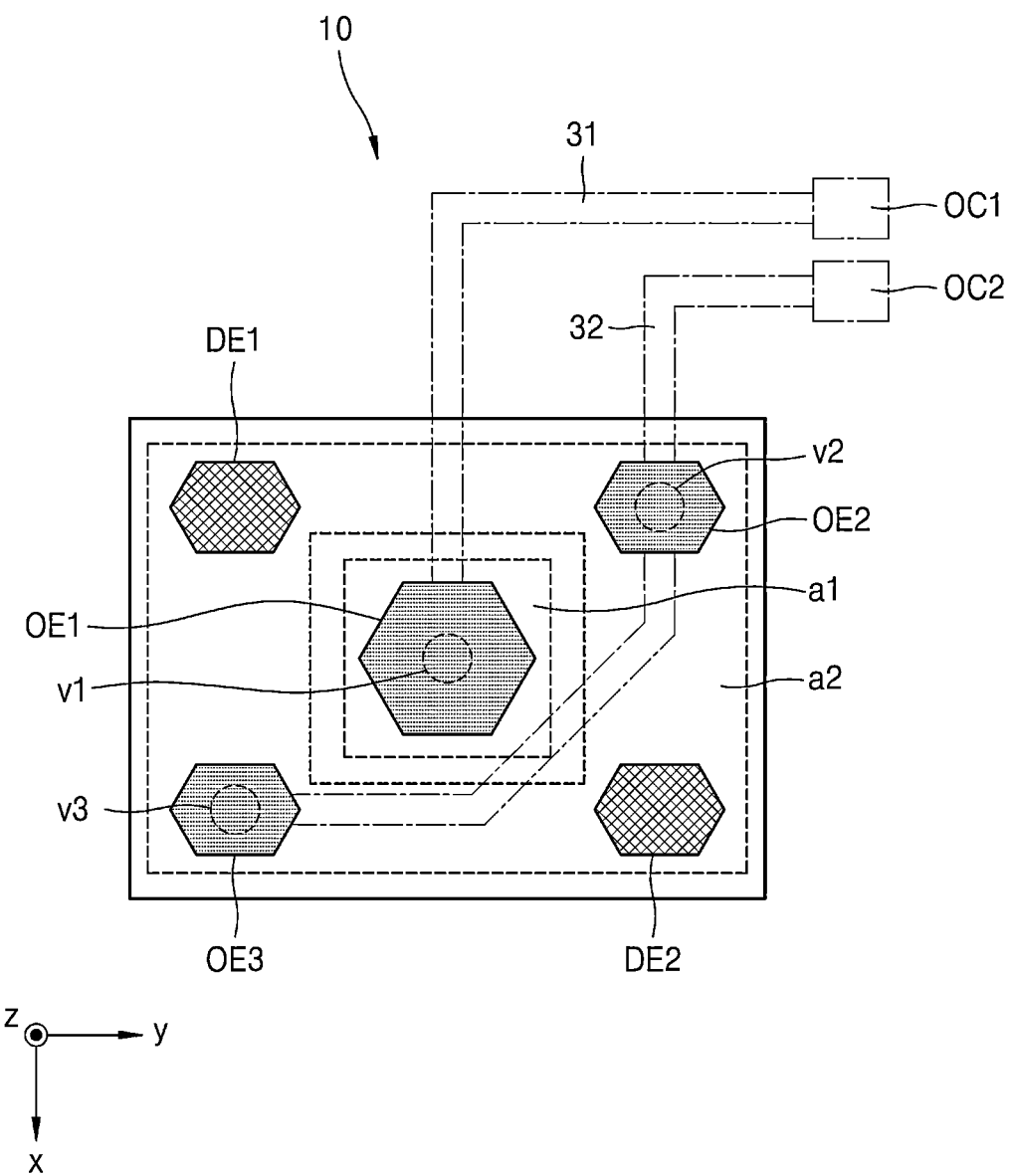
FIG. 3 illustrates a driving circuit board on which a plurality of driving electrodes are arranged on a first driving electrode region among a plurality of driving electrode regions according to an embodiment.
Figure 4:
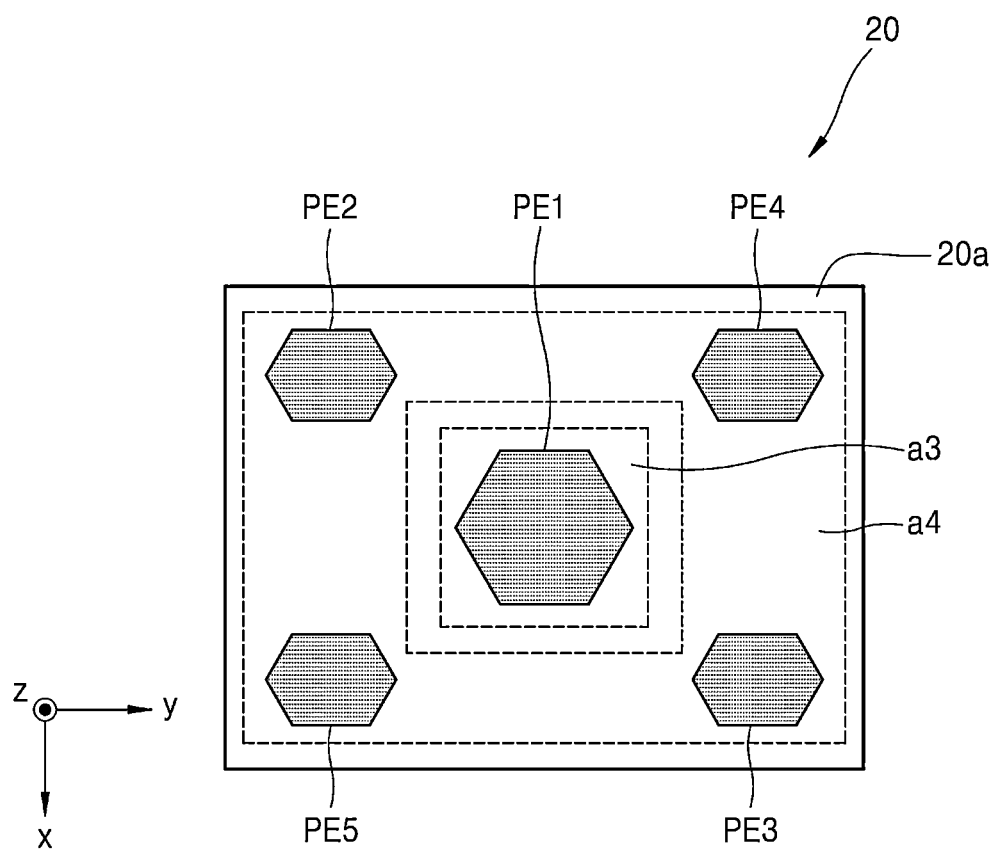
FIG. 4 illustrates a first electronic device on which a plurality of pad electrodes are arranged according to an embodiment.

FIG. 1 is a view illustrating a state in which a plurality of electronic devices 20 and 21 are transferred onto a driving circuit board 10 according to a method of manufacturing an electronic apparatus according to an embodiment. FIG. 2 illustrates an example structure of an electronic apparatus 1000 including a structure in which a plurality of electronic devices 20 and 21 and a driving circuit board 10 are connected according to an embodiment. FIG. 3 illustrates a state in which a plurality of driving electrodes OE2, OE3, DE1, and DE2 are arranged on a first driving electrode region K1 among a plurality of driving electrode regions K1 and K2 on a driving circuit board 10 according to an embodiment. FIG. 4 illustrates a state in which a plurality of pad electrodes PE1, PE2, PE3, PE4, and PE5 are arranged on a first electronic device 20 among a plurality of electronic devices 20 and 21 according to an embodiment.

Referring to FIG. 1, a plurality of electronic devices 20 and 21 may be transferred onto a driving circuit board 10 according to a method of manufacturing an electronic apparatus according to an embodiment. A plurality of driving electrode regions K1 and K2 may be provided on the driving circuit board 10, and the plurality of electronic devices 20 and 21 may be transferred in the plurality of driving electrode regions K1 and K2, respectively.

For example, the first electronic device 20 may be transferred in the first driving electrode region K1, and the second electronic device 21 may be transferred in the second driving electrode region K2. Although two electronic devices 20 and 21 and two driving electrode regions K1 and K2 are illustrated in FIG. 1, the embodiments are not limited thereto, and a myriad of driving electrode regions may be provided on the driving circuit board 10. In this case, a myriad of electronic devices may be transferred onto a myriad of driving electrode regions, respectively.

The driving circuit board 10 may include a first surface 10a and a second surface 10b opposite to each other. For example, the first surface 10a may be an upper surface of the driving circuit board 10, and the second surface 10b may be a lower surface of the driving circuit board 10. The plurality of driving electrode regions K1 and K2 may be provided on the first surface 10a of the first driving circuit board 10. For example, the plurality of driving electrode regions K1 and K2 may be two-dimensionally arranged on the first surface 10a. A plurality of driving electrodes may be symmetrically arranged in each of the plurality of driving electrode regions K1 and K2.

Each of the plurality of electronic devices 20 and 21 may include an upper surface and a lower surface opposite to each other, and a plurality of pad electrodes provided on the upper surface. For example, the first electronic device 20 may include a third surface 20a and a fourth surface 20b opposite to each other, and may include a plurality of pad electrodes provided on the third surface 20a. Here, the third surface 20a may be the upper surface of the first electronic device 20, and the fourth surface 20b may be the lower surface of the first electronic device 20. The first electronic device 20 and the second electronic device 21 may have substantially the same configuration.

As shown in FIG. 1, when the plurality of electronic devices 20 and 21 are transferred to the drive circuit board 10, the plurality of electronic devices 20 and 21 may be transferred to the drive circuit board 10 such that the plurality of pad electrode provided on the upper surface of each of the plurality of electronic elements 20 and 21 face the plurality of driving electrodes on the drive circuit board 10.

Referring to FIG. 2, the plurality of pad electrodes included in each of the plurality of electronic devices 20 and 21 may be electrically connected to a plurality of driving electrodes included in the plurality of driving electrode regions K1 and K2. For example, referring to FIGS. 2 to 4, a plurality of pad electrodes PE1, PE2, PE3, PE4, and PE5 included in the first electronic device 20 may be electrically connected to a plurality of driving electrodes OE1, OE2, OE3, DE1, and DE2 (e.g., operational driving electrodes OE1, OE2, and OE3 and dummy electrodes DE1 and DE2) included in the first driving electrode region K1. The plurality of pad electrodes PE1, PE2, PE3, PE4, and PE5 and the plurality of driving electrodes OE1, OE2, OE3, DE1, and DE2 may be arranged to correspond to each other.

An arrangement structure of the plurality of pad electrodes PE1, PE2, PE3, PE4, and PE5 included in the first electronic device 20 may be similarly applied to an arrangement structure of the plurality of pad electrodes included in the second electronic device 21. In addition, an arrangement structure of a plurality of driving electrodes OE1, OE2, OE3, DE1, and DE2 included in the first driving electrode region K1 may be similarly applied to an arrangement structure of a plurality of driving electrodes included in the second driving electrode region K2. Hereinafter, an arrangement structure of the plurality of pad electrodes PE1, PE2, PE3, PE4, and PE5 and the plurality of driving electrodes OE1, OE2, OE3, DE1, and DE2 will be described later with reference to FIGS. 3 and 4.

Referring to FIGS. 1 and 3, the plurality of driving electrodes OE1, OE2, OE3, DE1, and DE2 may be symmetrically arranged in the first driving electrode region K1 among the plurality of driving electrode regions K1 and K2. For example, the arrangement of a plurality of driving electrodes OE1, OE2, OE3, DE1, and DE2 may have radial symmetry. Likewise, a plurality of driving electrodes may be symmetrically arranged in a similar manner in the second driving electrode region K2.

Each of the plurality of driving electrode regions K1 and K2 may be an independently controlled region. For example, the plurality of driving electrodes OE1, OE2, OE3, DE1, and DE2 on the first driving electrode region K1 and the plurality of driving electrodes in the second driving electrode region K2 may be independently controlled.

The driving circuit board 10 may include a plurality of driving circuits for applying an electrical signal to each of the plurality of driving electrode regions K1 and K2. Each of the plurality of driving circuits may include one transistor and one capacitor. However, embodiments are not limited thereto, and each of the plurality of driving circuits may be configured in various forms.

Among the plurality of driving circuits, the first driving circuit may be electrically connected to some of the plurality of driving electrodes OE1, OE2, OE3, DE1, and DE2 provided in the first driving electrode region K1. Likewise, among the plurality of driving circuits, the second driving circuit may be electrically connected to some of the plurality of driving electrodes provided in the second driving electrode region K2.

Referring to FIG. 3, the first driving electrode region K1 may include a first sub-driving electrode region a1 and a second sub-driving electrode region a2 different from the first sub-driving electrode region a1. The plurality of driving electrodes OE1, OE2, OE3, DE1, and DE2 provided in the first driving electrode region K1 may include a first driving electrode OE1 provided in the first sub-driving electrode region a1 and second driving electrodes OE2, OE3, DE1, and DE2 provided in the second sub-driving electrode region a2. The second driving electrodes OE2, OE3, DE1, and DE2 may be electrically disconnected with respect to the first driving electrode OE1.

The first driving electrode OE1 may be a single electrode arranged in the first sub-driving electrode region a1. However, the embodiments are not limited thereto, and unlike FIG. 3, the first driving electrode OE1 may include a plurality of sub-driving electrodes spaced apart from each other in the first sub-driving electrode region a1.

The first driving electrode OE1 may be electrically connected to the first-1 driving circuit OC1. For example, the first driving electrode OE1 may be electrically connected to the first conductive wiring 31 electrically connected to the first-1 driving circuit OC1 through a first via v1 formed at a center thereof.

The second driving electrodes OE2, OE3, DE1, and DE2 may include at least one of first sub-driving electrodes OE2 and OE3 and at least one of first dummy electrodes DE1 and DE2, which are arranged to be spaced apart from each other in the second sub-driving electrode region a2. For example, the second driving electrodes OE2, OE3, DE1, and DE2 may include a first-1 sub-driving electrode OE2, a first-2 sub-driving electrode OE3, a first-1 dummy electrode DE1, and a first-2 dummy electrode DE2, which are provided to be spaced apart from each other in the second sub-driving electrode region a2. However, the embodiments are not limited thereto, and the second driving electrodes OE2, OE3, DE1, and DE2 may include three or more of the first sub-driving electrodes and three or more of the first dummy electrodes. In addition, the second driving electrodes OE2, OE3, DE1, and DE2 may include one of first sub-driving electrodes OE2 and OE3 and one of first dummy electrodes DE1 and DE2.

The at least one of the first sub-driving electrodes OE2 and OE3 may be electrically connected to the first-2 driving circuit OC2. In contrast, at least one of the first dummy electrodes DE1 and DE2 may not be electrically connected to the first-2 drive circuit OC2.

For example, the first-1 sub-driving electrode OE2 may be electrically connected to the second conductive wiring 32 electrically connected to the first-2 driving circuit OC2 through a second via v2 formed at a center thereof. The first-2 sub-driving electrode OE3 may be electrically connected to the second conductive wiring 32 electrically connected to the first-2 driving circuit OC2 through a third via v3 formed at a center thereof. As such, the at least one of the first sub-driving electrodes OE2 and OE3 included in the second driving electrodes OE2, OE3, DE1, and DE2 may be electrically connected to the first-2 drive circuit OC2 through the second conductive wiring 32.

The first-1 dummy electrode DE1 and the first-2 dummy electrode DE2 may not be electrically connected to the first-2 driving circuit OC2. In addition, the first-1 dummy electrode DE1 and the first-2 dummy electrode DE2 may be electrically disconnected with respect to at least one of the first sub-driving electrodes OE2 and OE3 included in the second driving electrodes OE2, OE3, DE1, and DE2. Accordingly, the electrical signal applied from the first-2 driving circuit OC2 to the at least one of the first sub-driving electrodes OE2 and OE3 may not be transferred to the first-1 dummy electrode DE1 and the first-2 dummy electrode DE2.

As described above with reference to FIG. 3, the first driving electrode OE1 among the plurality of driving electrodes OE1, OE2, OE3, DE1, and DE2 may be electrically connected to the first-1 driving circuit OC1, and the first-1 sub-driving electrode OE1 and the first-2 sub-driving electrode OE2 may be electrically connected to the first-2 driving circuit OC2. In addition, the first-1 dummy electrode DE1 and the first-2 dummy electrode DE2 which are the remaining parts except for the first driving electrode OE1, the first-1 sub-driving electrode OE2, and the first-2 sub-driving electrode OE3 from among the plurality of driving electrodes OE1, OE2, OE3, DE1, and DE2 may not be electrically connected to the first driving circuit OC1 or the second driving circuit OC2.

The first sub-driving electrode region a1 may be a central region of the first driving electrode region K1, and the second sub-driving electrode region a2 may be a region surrounding the first sub-driving electrode region a1. In this case, the second driving electrodes OE2, OE3, DE1, and DE2 provided in the second sub-driving electrode region a2 may be arranged to surround the first driving electrode OE1 provided in the first sub-driving electrode region a1. Although FIG. 3 shows that there is a predetermined gap between the first sub-driving electrode region a1 and the second sub-driving electrode region a2, this is exemplary, and the first sub-driving electrode region a1 and the second sub-driving electrode region a2 may directly contact each other.

Referring to FIG. 3, the first-1 sub-driving electrode OE2 and the first-2 sub-driving electrode OE3 may be arranged opposite to each other in a first diagonal direction with the first driving electrode OE1 interposed therebetween. In addition, the first-1 dummy electrode DE1 and the first-2 dummy electrode DE2 may be arranged opposite to each other in a second diagonal direction crossing the first diagonal direction with the first driving electrode OE1 interposed therebetween. For example, the first-1 dummy electrode DE1, the first-1 sub-driving electrode OE2, the first-2 dummy electrode DE2, and the first-2 sub-driving electrode OE3 may be sequentially arranged clockwise around the first driving electrode OE1. In this case, the plurality of driving electrodes OE1, OE2, OE3, DE1, and DE2 may be arranged in the first driving electrode region K1 to be x-axis symmetrical and y-axis symmetrical. For example, lines connecting the center points of the first-1 dummy electrode DE1, the first-1 sub-driving electrode OE2, the first-2 dummy electrode DE2, and the first-2 sub-driving electrode OE3 may form a rectangular or square shape.

Referring to FIG. 4, the third surface 20a of the first electronic device 20 may include a first pad region a3 and a second pad region a4 different from the first pad region a3. The plurality of pad electrodes PE1, PE2, PE3, PE4, and PE5 provided on the third surface 20a of the first electronic device 20 may include a first pad electrode PE1 provided in the first pad region a3 and second pad electrodes PE2, PE3, PE4, and PE5 provided in the second pad region a4. The second pad electrodes PE2, PE3, PE4, and PE5 may be electrically disconnected with respect to the first pad electrode PE1.

The first pad region a3 and the second pad region a4 may correspond to the first sub-driving electrode region a1 and the second sub-driving electrode region a2, respectively. For example, the first sub-driving electrode region a1 and the first pad region a3 may correspond to each other, and the second sub-driving electrode region a2 and the second pad region a4 may correspond to each other. Accordingly, when the first electronic device 20 is transferred in the first driving electrode region K1, the first driving electrode OE1 provided in the first sub-driving electrode region a1 may be electrically connected to the first pad electrode PE1 provided in the first pad region a3. In addition, when the first electronic device 20 is transferred on the first driving electrode region K1, the second driving electrodes OE2, OE3, DE1, and DE2 provided in the second sub-driving electrode region a2 may be electrically connected to the second pad electrodes PE2, PE3, PE4, and PE5 provided in the second pad region a4.

The first pad electrode PE1 may be a single electrode arranged in the first pad region a3. However, the embodiments are not limited thereto, and unlike FIG. 4, the first pad electrode PE1 may include a plurality of sub-pad electrodes arranged to be spaced apart from each other in the first pad region a3.

The second pad electrodes PE2, PE3, PE4, and PE5 may include at least one of the first sub-pad electrodes PE2, PE3, PE4, and PE5 arranged to be spaced apart from each other in the second pad region a4. For example, the second pad electrode PE2, PE3, PE4, and PE5 may include a first-1 sub-pad electrode PE2, a first-2 sub-pad electrode PE3, a first-3 sub-pad electrode PE4, and a first-4 sub-pad electrode PE5, which are provided to be spaced apart from each other in the second pad region a4. However, the embodiments are not limited thereto, and the second pad electrodes PE2, PE3, PE4, and PE5 may include two or more of the second sub-pad electrodes PE2, PE3, PE4, and PE5. The at least one of the first sub-pad electrodes PE2, PE3, PE4, and PE5 may be electrically connected to at least one second driving electrode OE2 or OE3 except for the first dummy electrodes DE1 and DE2.

The first pad region a3 may be a central region of the third surface 20a, and the second pad region a4 may be a region surrounding the first pad region a3. In this case, at least one of the first sub-pad electrodes PE2, PE3, PE4, and PE5 provided in the second pad region a4 may be arranged to surround the first pad electrode PE1 provided in the first pad region a3. Although FIG. 4 illustrates that the first pad region a3 and the second pad region a4 are separated from each other by a gap, this is an example, and the first pad region a3 and the second pad region a4 may directly contact each other.

Referring to FIG. 4, the first-1 sub-pad electrode PE2 and the first-2 sub-pad electrode PE3 may be arranged opposite to each other in a third diagonal direction with the first pad electrode PE1 interposed therebetween. In addition, the first-3 sub-pad electrode PE4 and the first-4 sub-pad electrode PE5 may be arranged opposite to each other in a fourth diagonal direction crossing the third diagonal direction with the first pad electrode PE1 interposed therebetween. For example, the first-1 sub-pad electrode PE2, the first-3 sub-pad electrode PE4, the first-2 sub-pad electrode PE3, and the first-4 sub-pad electrode PE5 may be sequentially arranged clockwise around the first pad electrode PE1. In this case, the plurality of pad electrodes PE1, PE2, PE3, PE3, PE4, and PE5 may be arranged to be x-axis symmetrical and y-axis symmetrical on the third surface 20a. For example, lines connecting the center points of the first-1 sub-pad electrode PE2, the first-3 sub-pad electrode PE4, the first-2 sub-pad electrode PE3, and the first-4 sub-pad electrode PE5 may form a rectangular or square shape.

Figure 5:
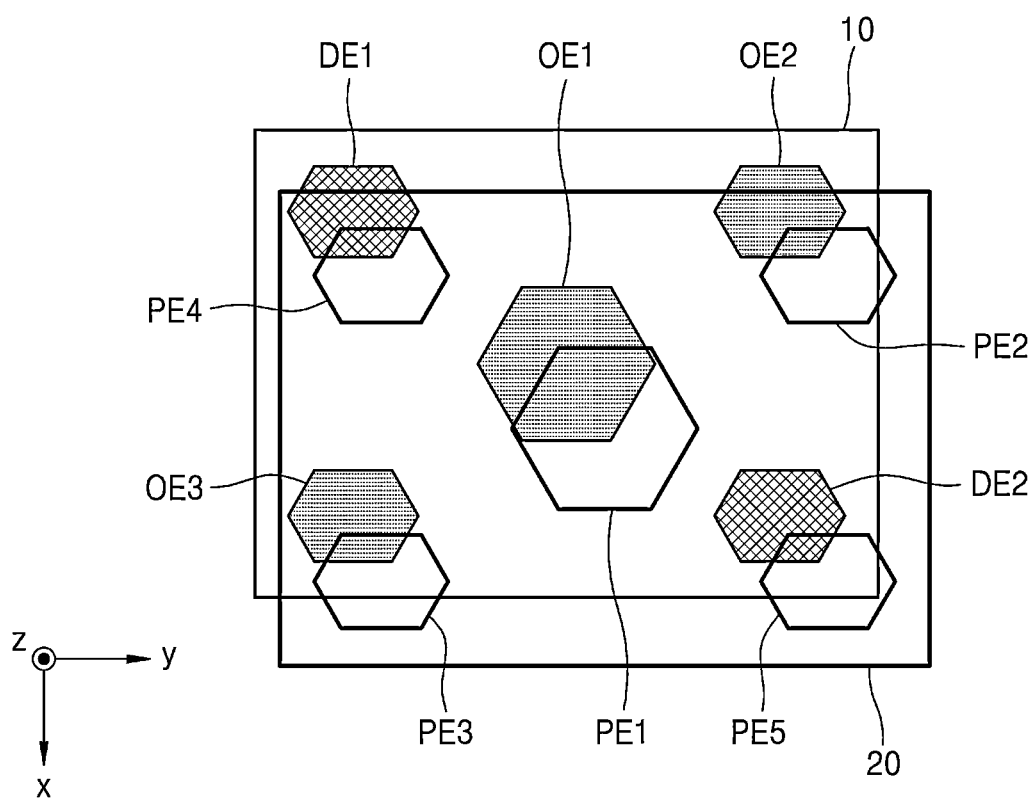
FIG. 5 illustrates a state in which a first electronic device among a plurality of electronic devices according to an embodiment is arranged on a first driving electrode region of a driving circuit board.
Figure 6:
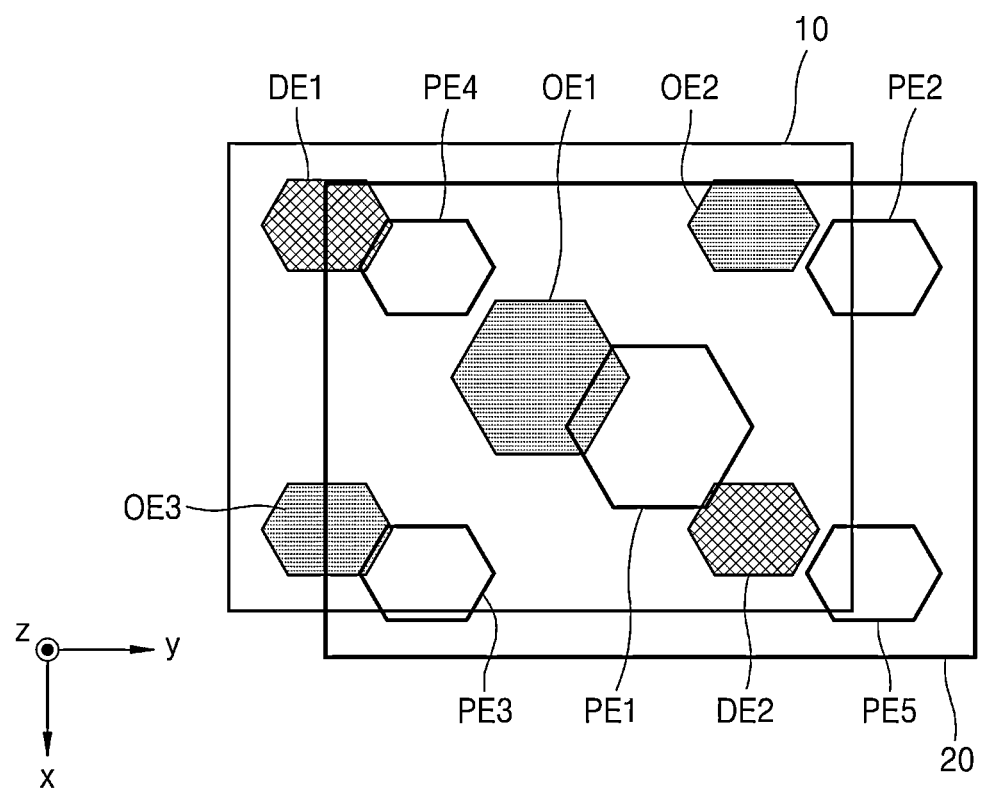
FIG. 6 illustrates a state in which a first electronic device among a plurality of electronic devices according to another embodiment is arranged on a first driving electrode region of a driving circuit board.

FIG. 5 illustrates a state in which a first electronic device 20 among a plurality of electronic devices 20 and 21 according to an embodiment is arranged on the first driving electrode region K1 of the driving circuit board 10. FIG. 6 illustrates a state in which a first electronic device 20 among a plurality of electronic devices 20 and 21 according to another embodiment is arranged on the first driving electrode region K1 of the driving circuit board 10.

Referring to FIG. 5, the first electronic device 20 may be transferred in the first driving electrode region K1 of the driving circuit board 10. In this case, the first electronic device 20 may be transferred on the first driving electrode region K1 such that the center of the third surface 20a of the first electronic device 20 is spaced apart (offset) from the center of the first driving electrode region K1 in the x-y plane by a first distance.

Accordingly, the first driving electrode OE1 and the first pad electrode PE1 may be connected so that a portion thereof overlaps each other. In this case, a center of a surface of the first driving electrode OE1 contacting the first pad electrode PE1 may be spaced apart (offset) from a center of a surface of the first pad electrode PE1 contacting the first driving electrode OE1 by a predetermined distance in the x-y plane.

The first-1 sub-driving electrode OE2 and the first-1 sub-pad electrode PE2 may be connected so that a portion thereof overlaps each other. In this case, a center of a surface of the first-1 sub-driving electrode OE2 in contact with the first-1 sub-pad electrode PE2 may be spaced apart (offset) from a center of a surface of the first-1 sub-pad electrode PE2 in contact with the first-1 sub-driving electrode OE2 by a predetermined distance in the x-y plane.

The first-2 sub-driving electrode OE3 and the first-2 sub-pad electrode PE3 may be connected so that a portion thereof overlaps each other. In this case, a center of a surface of the first-2 sub-driving electrode OE3 in contact with the first-2 sub-pad electrode PE3 may be spaced apart (offset) from a center of a surface of the first-2 sub-pad electrode PE3 in contact with the first-2 sub-driving electrode OE3 by a predetermined distance in the x-y plane.

The first-1 dummy electrode DE1 and the first-3 sub-pad electrode PE4 may be connected so that a portion thereof overlaps each other. In this case, a center of a surface of the first-1 dummy electrode DE1 in contact with the first-3 sub-pad electrode PE4 may be spaced apart from a center of a surface of the first-3 sub-pad electrode PE4 in contact with the first-1 dummy electrode DE1 by a predetermined distance in the x-y plane.

The first-2 dummy electrode DE2 and the first-4 sub-pad electrode PE5 may be connected so that a portion thereof overlaps each other. In this case, a center of a surface of the first-2 dummy electrode DE2 contacting the first-4 sub-pad electrode PE5 may be spaced apart (offset) from a center of a surface of the first-4 sub-pad electrode PE5 contacting the first-2 dummy electrode DE2 by a predetermined distance in the x-y plane.

In this way, in the transfer process, for each of the plurality of driving electrodes OE1, OE2, OE3, DE1, and DE2, the electronic device 20 may be transferred onto the first drive electrode region K1 such that the center point of each of the plurality of pad electrodes PE1, PE2, PE3, PE4, and PE5 does not match each other in the x-y plane. However, even in this case, the first pad electrode PE1 and the first driving electrode OE1 corresponding to each other may be electrically connected to each other, and the second pad electrodes PE2, PE3, PE4, and PE5 and the second driving electrodes OE2, OE3, DE1, and DE2 corresponding to each other may be electrically connected to each other.

The electrical signal from the first-1 driving circuit OC1 may be transferred to the first pad electrode PE1 through the first driving electrode OE1. In addition, the electrical signal from the first-2 driving circuit OC2 may be transferred to the second pad electrodes PE2, PE3, PE4, and PE5 through the first-1 sub-driving electrode OE2 and the first-2 sub-driving electrode OE3.

Referring to FIG. 6, the first electronic device 20 may be transferred in the first driving electrode region K1 of the driving circuit board 10. In this case, the first electronic device 20 may be transferred on the first driving electrode region K1 such that the center of the third surface 20a of the first electronic device 20 is spaced apart (offset) from the center of the first driving electrode region K1 in the x-y plane by a second distance that is longer than a first distance.

Accordingly, the first driving electrode OE1 and the first pad electrode PE1 may be connected so that a portion thereof overlaps each other. In this case, a center of a surface of the first driving electrode OE1 contacting the first pad electrode PE1 may be spaced apart from a center of a surface of the first pad electrode PE1 contacting the first driving electrode OE1 by a predetermined distance in the x-y plane.

The first-1 sub-driving electrode OE2 and the first-1 sub-pad electrode PE2 may not overlap each other. In this case, a center of a surface of the first-1 sub-driving electrode OE2 facing the first-1 sub-pad electrode PE2 may be spaced apart from a center of a surface of the first-1 sub-pad electrode PE2 facing the first-1 sub-driving electrode OE2 by a predetermined distance in the x-y plane.

The first-2 sub-driving electrode OE3 and the first-2 sub-pad electrode PE3 may be connected so that a portion thereof overlaps each other. In this case, a center of a surface of the first-2 sub-driving electrode OE3 in contact with the first-2 sub-pad electrode PE3 may be spaced apart from a center of a surface of the first-2 sub-pad electrode PE3 in contact with the first-2 sub-driving electrode OE3 by a predetermined distance in the x-y plane.

The first-1 dummy electrode DE1 and the first-3 sub-pad electrode PE4 may be connected so that a portion thereof overlaps each other. In this case, a center of a surface of the first-1 dummy electrode DE1 in contact with the first-3 sub-pad electrode PE4 may be spaced apart from a center of a surface of the first-3 sub-pad electrode PE4 in contact with the first-1 dummy electrode DE1 by a predetermined distance in the x-y plane.

The first-2 dummy electrode DE2 and the first-4 sub-pad electrode PE5 may not overlap each other. In this case, a center of a surface of the first-2 dummy electrode DE2 facing the first-4 sub-pad electrode PE5 may be spaced apart from a center of a surface of the first-4 sub-pad electrode PE5 facing the first-2 dummy electrode DE2 by a predetermined distance in the x-y plane.

In this way, when the first electronic device 20 is transferred on the first driving electrode region K1, the first electronic device 20 may be transferred on the first driving electrode region K1 so that center points of the plurality of pad electrodes PE1, PE2, PE3, PE4, and PE5 do not match (are not aligned with) each other in the x-y plane. In this case, the first electronic device 20 may be transferred onto the first driving electrode region K1 so that the first pad electrode PE1 is connected to partially overlap the first driving electrode OE1 and is simultaneously connected to partially overlap the second dummy electrode DE2. However, since the first-2 dummy electrode DE2 among the second driving electrodes PE2, PE3, DE1, and DE2 is not electrically connected to the first-2 driving circuit OC2, an electrical signal from the first-2 driving circuit OC2 may not be transferred to the first pad electrode PE1.

The electrical signal from the first-1 driving circuit OC1 may be transferred to the first pad electrode PE1 through the first driving electrode OE1. In addition, the electrical signal from the first-2 driving circuit OC2 may be transferred to the second pad electrodes PE2, PE3, PE4, and PE5 through the second sub-driving electrode OE3.

As described above, even when the first electronic device 20 is transferred to the first driving electrode region K1 such that the first electronic device 20 does not match (is not aligned with) the first driving electrode region K1 in view of the center points thereof, and the first pad electrode PE1 contacts not only the first driving electrode OE1 but also one or more of the second driving electrodes OE2, OE3, DE1, and DE2, electrical contact between the plurality of pad electrodes PE1, PE2, PE3, PE4, and PE5 and the plurality of driving electrodes OE1, OE2, OE3, DE1, and DE2 may be formed so that the first pad electrode PE1 and the second pad electrodes PE2, PE3, PE4, and PE5 may apply independent electrical signals to each other.

Figure 7:
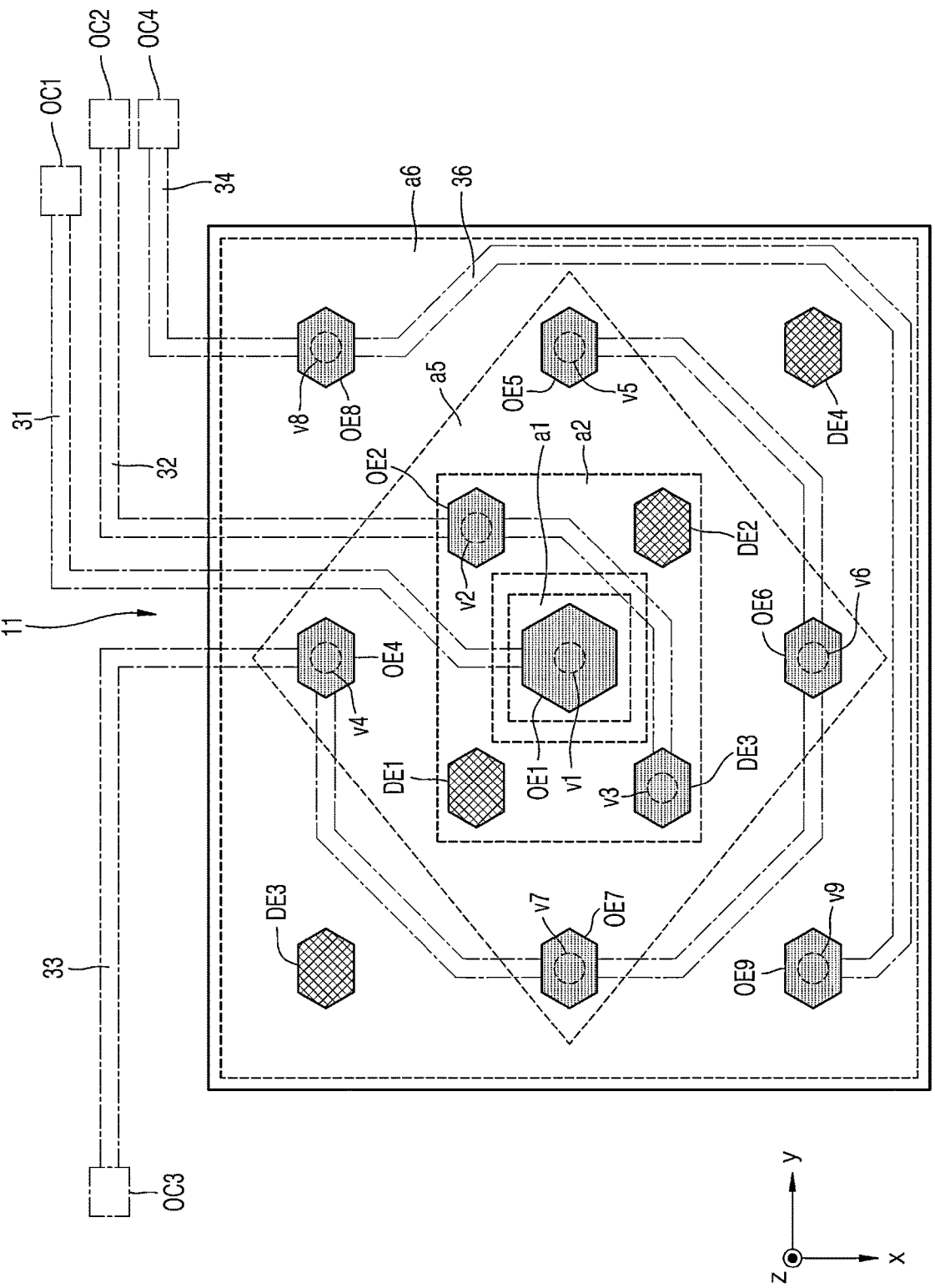
FIG. 7 illustrates a driving circuit board on which a plurality of driving electrodes are arranged on a first driving electrode region among a plurality of driving electrode regions according to another embodiment.
Figure 8:
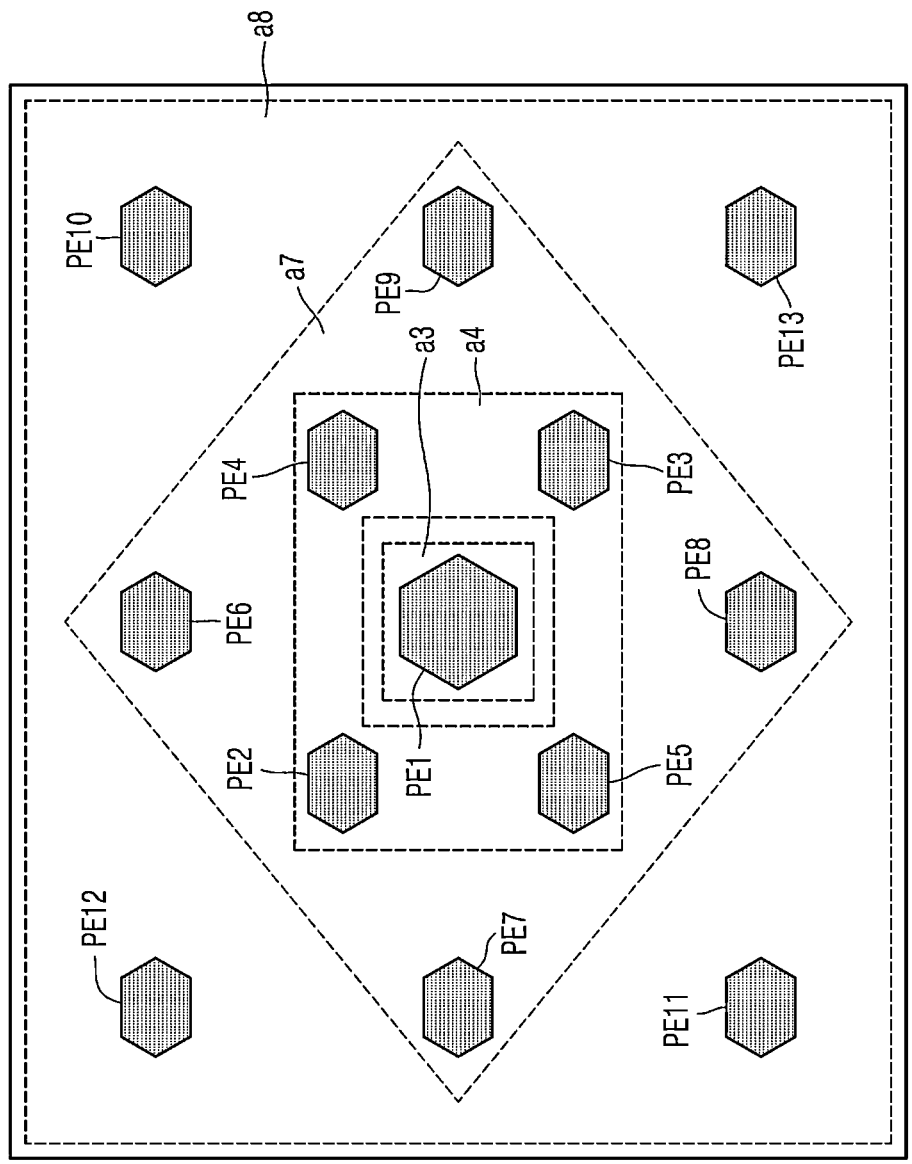
FIG. 8 illustrates a first electronic device on which a plurality of pad electrodes are arranged according to an embodiment.
Figure 8:
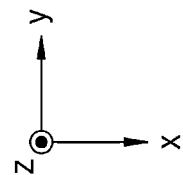

FIG. 7 illustrates a state in which a plurality of driving electrodes OE1, OE2, OE3, OE4, OE5, OE6, OE7, OE8, OE9, DE1, DE2, DE3, and DE4 are arranged in a first driving electrode region from among a plurality of driving electrode regions on a driving circuit board 11 according to another embodiment. FIG. 8 illustrates a state where a plurality of pad electrodes PE1, PE2, PE3, PE4, PE5, PE6, PE7, PE8, PE9, PE10, PE11, PE12, and PE13 are arranged on the first electronic device 22 among the plurality of electronic devices according to another embodiment.

The state in which the plurality of driving electrodes OE1, OE2, OE3, OE4, OE5, OE6, OE7, OE8, OE9, DE1, DE2, DE3, and DE4 are arranged in the first driving electrode region of the driving circuit board 11 of FIG. 7 may be substantially the same as a state in which the plurality of driving electrodes OE1, OE2, OE3, DE1, and DE2 are arranged in the first driving electrode region K1 of the driving circuit board 10 of FIG. 3, except that the third sub-driving electrode region a5 and the fourth sub-driving electrode region a6 surrounding the first sub-driving electrode region a1 and the second sub-driving electrode region a2 are further included. In the description of FIG. 7, the duplicated description of FIG. 3 is omitted.

The arrangement of the plurality of pad electrodes PE1, PE2, PE3, PE4, PE5, PE6, PE7, PE8, PE9, PE10, PE11, PE12, and PE13 on the first electronic device 22 of FIG. 8 may be substantially the same as the arrangement of the plurality of pad electrodes PE1, PE2, PE3, PE4, and PE5 on the first electronic device 20 of FIG. 4, except that the third pad region a7 and the fourth pad region a8 surrounding the first pad region a3 and the second pad region a4 are further included. In the description of FIG. 8, the duplicated description of FIG. 4 is omitted.

Referring to FIG. 7, the first driving electrode region of the driving circuit board 11 may include a first sub-driving electrode region a1 and a second sub-driving electrode region a2 different from the first sub-driving electrode region a1. In addition, the first driving electrode region of the driving circuit board 11 may further include a third sub-driving electrode region a5 different from the first and second sub-driving electrode regions a1 and a2 and a fourth sub-driving electrode region a6 different from the first to third sub-driving electrode regions a1, a2, and a5.

The plurality of driving electrode OE1, OE2, OE3, OE4, OE5, OE6, OE7, OE8, OE9, DE1, DE2, DE3, and DE4 provided in the first driving electrode region of the driving circuit board 11 may include the first driving electrode OE1 provided in the driving electrode region a1 and the second driving electrodes OE2, OE3, DE1, and DE2 provided in the second sub-driving electrode region a2. The second driving electrodes OE2, OE3, DE1, and DE2 may be electrically disconnected with respect to the first driving electrode OE1. The first driving electrode OE1 may be electrically connected to the first-1 driving circuit OC1, and the first-1 sub-driving electrode OE1 and the first-2 sub-driving electrode OE2 included in the second driving electrodes OE1, OE2, DE1, and DE2 may be electrically connected to the first-2 driving circuit OC2.

In addition, the plurality of driving electrodes OE1, OE2, OE3, OE4, OE5, OE6, OE7, OE8, OE9, DE1, DE2, DE3, and DE4 provided in the first driving electrode region of the driving circuit board 11 may include third driving electrodes OE4, OE5, OE6, and OE7 provided in the third sub-driving electrode region a5, and fourth driving electrodes OE8, OE9, DE3, and DE4 provided in the fourth sub-driving electrode region a6. The third driving electrodes OE4, OE5, OE6, and OE7 may be formed to be electrically disconnected with respect to the first and second driving electrodes OE1, OE2, OE3, DE1, and DE2. The fourth driving electrode OE8, OE9, DE3, and DE4 may be formed to be electrically disconnected with respect to the first and third driving electrodes OE1, OE2, OE3, OE4, OE5, OE6, OE7, DE1, and DE2.

The third driving electrode OE4, OE5, OE6, and OE7 may include at least one of the second sub-driving electrodes OE4, OE5, OE6, and OE7 arranged to be spaced apart from each other in the third sub-driving electrode region a5. For example, the third driving electrodes OE4, OE5, OE6, and OE7 may include a second-1 sub-driving electrode OE4, a second-2 sub-driving electrode OE5, a second-3 sub-driving electrode OE6, and a second-4 sub-driving electrode OE7, which are provided to be spaced apart from each other in the third sub-driving electrode region a5. However, the embodiments are not limited thereto, and the third driving electrodes OE4, OE5, OE6, and OE7 may include five or more of the second sub-driving electrodes OE4, OE5, OE6, and OE7. In addition, the third driving electrodes OE4, OE5, OE6, and OE7 may include three or less of the second sub-driving electrodes OE4, OE5, OE6, and OE7.

The at least one of the second sub-driving electrodes OE4, OE5, OE6, and OE7 arranged to be spaced apart from each other in the third sub-driving electrode region a5 may be electrically connected to the first-3 driving circuit OC3. For example, the second-1 sub-driving electrode OE4 may be electrically connected to the third conductive wiring 33 electrically connected to the first-3 driving circuit OC3 through a fourth via v4 formed at a center thereof. The second-2 sub-driving electrode OE5 may be electrically connected to the third conductive wiring 33 electrically connected to the first-3 driving circuit OC3 through a fifth via v5 formed at a center thereof. The second-3 sub-driving electrode OE6 may be electrically connected to the third conductive wiring 33 electrically connected to the first-3 driving circuit OC3 through a sixth via v6 formed at a center thereof. The second-4 sub-driving electrode OE7 may be electrically connected to the third conductive wiring 33 electrically connected to the first-3 driving circuit OC3 through a seventh via v7 formed at a center thereof. As described above, the at least one of the second sub-driving electrodes OE4, OE5, OE6, and OE7 included in the third driving electrode OE4, OE5, OE6, and OE7 may be electrically connected to the first-3 driving circuit OC3 through the third conductive wiring 33.

The fourth driving electrodes OE8, OE9, DE3, and 0E4 may include at least one of the third sub-driving electrodes OE8 and OE9 and at least one of the second dummy electrodes DE3 and DE4, which are arranged to be spaced apart from each other in the fourth sub-driving electrode region a6. For example, the fourth driving electrodes OE8, OE9, DE3, and DE4 may include a third-1 sub-driving electrode OE8, a third-2 sub-driving electrode OE9, a second-1 dummy electrode DE3, and a second-2 dummy electrode DE4, which are provided to be spaced apart from each other in the fourth sub-driving electrode region a6. However, the embodiments are not limited thereto, and the fourth driving electrodes may include three or more of third sub-driving electrodes and three or more of second dummy electrodes. In addition, the fourth driving electrodes may include one of the third sub-driving electrodes and one of the second dummy electrodes.

At least one of the third sub-driving electrodes OE8 and OE9 may be electrically connected to the first-4 driving circuit OC4. The at least one of the second dummy electrodes DE3 and DE4 may not be electrically connected to the first-4 driving circuit OC4.

For example, the third-1 sub-driving electrode OE8 may be electrically connected to the fourth conductive wiring 34 electrically connected to the first-4 driving circuit OC3 through an eighth via v8 formed at a center thereof. The third-2 sub-driving electrode OE9 may be electrically connected to the fourth conductive wiring 34 electrically connected to the first-4 driving circuit OC4 through a ninth via v9 formed at a center thereof. In this way, at least one third sub-driving electrodes OE8 and OE9 included in the fourth driving electrode OE8, OE9, DE3, and DE4 may be electrically connected to the first-4 driving circuit OC4 through the fourth conductive wiring 34.

The second-1 dummy electrode DE3 and the second-2 dummy electrode DE4 may not be electrically connected to the first-4 driving circuit OC4. In addition, the second-1 dummy electrode DE3 and the second-2 dummy electrode DE4 may be electrically disconnected with respect to at least one of the third sub-driving electrodes OE8 and OE9 included in the fourth driving electrodes OE8, OE9, DE3, and DE4. Accordingly, the electrical signal applied from the first-4 driving circuit OC4 to the at least one of the third sub-driving electrodes OE8 and OE9 may not be transferred to the second-1 dummy electrode DE3 and the second-2 dummy electrode DE4.

As described above with reference to FIG. 7, among the plurality of driving electrodes OE1, OE2, OE3, OE4, OE5, OE6, OE7, OE8, OE9, DE1, DE2, DE3, and DE4, the third driving electrodes OE4, OE5, OE6, and OE7 may be electrically connected to the first-3 driving circuit OC3, and the third-1 sub-driving electrode OE8 and the third-2 sub-driving electrode OE9 may be electrically connected to the first-4 driving circuit OC4. In addition, the second-1 dummy electrode DE3 and the second-2 dummy electrode DE4 which are the remaining parts except for the first driving electrode OE1, the second driving electrodes OE2, OE3, DE1, and DE2, the third driving electrodes OE4, OE5, OE6, and OE7, the third-1 sub-driving electrode OE8 and the third-2 sub-driving electrode OE9, from among the plurality of driving electrodes OE1, OE2, OE3, OE4, OE5, OE6, OE7, OE8, OE9, DE1, DE2, DE3, and DE4 may not be electrically connected to the first-1 driving circuit OC1, the first-2 driving circuit OC2, the first-3 driving circuit OC3, or the first-4 driving circuit OC4.

The first sub-driving electrode region a1 may be a central region of the first driving electrode region of the driving circuit board 11, and the second sub-driving electrode region a2 may be a region surrounding the first sub-driving electrode region a1. In addition, the third sub-driving electrode region a5 may be a region surrounding the second sub-driving electrode region a2, and the fourth sub-driving electrode region a6 may be a region surrounding the third sub-driving electrode region a5.

In this case, the third driving electrode OE4, OE5, OE6, and OE7 provided in the third sub-driving electrode region a5 may be arranged to surround the second driving electrodes OE2, OE3, DE1, and DE2 provided in the second sub-driving electrode region a2. In addition, the fourth driving electrode OE8, OE9, DE3, and DE4 provided in the fourth sub-driving electrode region a6 may be arranged to surround the third driving electrodes OE4, OE5, OE6, and OE7 provided in the third sub-driving electrode region a5.

For example, the second-1 sub-driving electrode OE4, the second-2 sub-driving electrode OE5, the second-3 sub-driving electrode OE6, and the second-4 sub-driving electrode OE7 may be sequentially arranged clockwise around the first driving electrode OE1. For example, the second-1 sub-driving electrode OE4 and the second-3 sub-driving electrode OE6 may be arranged opposite to each other in a vertical direction (e.g., x-direction) with the first driving electrode OE1 interposed therebetween. In addition, the second-2 sub-driving electrode OE5 and the second-4 sub-driving electrode OE7 may be arranged opposite to each other in a horizontal direction (e.g., y-direction) with the first driving electrode OE1 interposed therebetween.

Referring to FIG. 7, the second-1 dummy electrode DE3, the third-1 sub-driving electrode OE8, the second-2 dummy electrode DE4, and the third-2 sub-driving electrode OE9 may be sequentially arranged in a clockwise direction around the first driving electrode OE1. For example, the third-1 sub-driving electrode OE8 and the third-2 sub-driving electrode OE9 may be arranged opposite to each other in a first diagonal direction with the first driving electrode OE1 interposed therebetween. In addition, the second-1 dummy electrode DE3 and the second-2 dummy electrode DE4 may be arranged to face each other in a second diagonal direction crossing the first diagonal direction with the first driving electrode OE1 interposed therebetween.

In this case, the plurality of driving electrodes OE1, OE2, OE3, OE4, OE5, OE6, OE7, OE8, OE9, DE1, DE2, DE3, and DE4 may be arranged in the first driving electrode region of the driving circuit board 11 to be x-axis symmetrical and y-axis symmetrical. For example, lines connecting the center points of the second-1 sub-driving electrode OE4, the second-2 sub-driving electrode OE5, the second-3 sub-driving electrode OE6, and the second-4 sub-driving electrode OE7 may form a rhombus or square shape. In addition, lines connecting the center points of the second-1 dummy electrode DE3, the third-1 sub-driving electrode OE8, the second-1 dummy electrode DE4, and the third-2 sub-driving electrode OE9 may form a rectangular or square shape.

Referring to FIG. 8, the upper surface of the first electronic device 20 may include a first pad region a3 and a second pad region a4 different from the first pad region a3. In addition, the upper surface of the first electronic device 22 may further include a third pad region a7 different from the first and second pad regions a3 and a4, and a fourth pad region a8 different from the first to third pad regions a3, a4, and a7.

The plurality of pad electrodes PE1, PE2, PE3, PE4, PE5, PE6, PE7, PE8, PE9, PE10, PE11, PE12, and PE13 provided on the upper surface of the first electronic device 22 may include a first pad electrode PE1 on the first pad region a3 and second pad electrodes PE2, PE3, PE4, and PE5 on the second pad region a4. The second pad electrodes PE2, PE3, PE4, and PE5 may be electrically disconnected with respect to the first pad electrode PE1.

In addition, the plurality of pad electrodes PE1, PE2, PE3, PE4, PE5, PE6, PE7, PE8, PE9, PE10, PE11, PE12, and PE13 provided on the upper surface of the first electronic device 22 may include the third pad electrodes PE6, PE7, PE8, and PE9 provided in the third pad region a7 and the fourth pad electrodes PE10, PE11, PE12, and PE13 provided in the fourth pad region a8. The third pad electrodes PE6, PE7, PE8, and PE9 may be formed to be electrically disconnected with respect to the first and second pad electrodes PE1, PE2, PE3, PE4, and PE5. The fourth pad electrode PE10, PE11, PE12, and PE13 may be formed to be electrically disconnected with respect to the first to third pad electrodes PE1, PE2, PE3, PE4, PE5, PE6, PE7, PE8, and PE9.

The third pad region a7 and the fourth pad region a8 may correspond to the third sub-driving electrode region a5 and the fourth sub-driving electrode region a6, respectively. For example, the third sub-driving electrode region a5 and the third pad region a7 may correspond to each other, and the fourth sub-driving electrode region a6 and the fourth pad region a8 may correspond to each other. Accordingly, when the first electronic device 22 is transferred in the first driving electrode region of the driving circuit board 11, the third driving electrodes OE4, OE5, OE6, and OE7 provided in the third sub-driving electrode region a5 may be electrically connected to the third pad electrodes PE6, PE7, PE8, and PE9 provided in the third pad region a7. In addition, when the first electronic device 22 is transferred onto the first driving electrode region of the driving circuit board 11, the fourth driving electrodes OE8, OE9, DE3, and DE4 provided in the fourth sub-driving electrode region a6 may be electrically connected to the fourth pad electrodes PE10, PE11, PE12, and PE13 provided in the fourth pad region a8.

The third pad electrodes PE6, PE7, PE8, and PE9 may include at least one of the second sub-pad electrodes PE6, PE7, PE8, and PE9 arranged to be spaced apart from each other in the third pad region a7. For example, the third pad electrodes PE6, PE7, PE8, and PE9 may include a second-1 sub-pad electrode PE6, a second-2 sub-pad electrode PE7, a second-3 sub-pad electrode PE8, and a second-4 sub-pad electrode PE9, which are provided to be spaced apart from each other in the third pad region a7. However, the embodiments are not limited thereto, and the third pad electrodes PE6, PE7, PE8, and PE9 may include five or more second sub-pad electrodes PE6, PE7, PE8, and PE9. In addition, the third pad electrodes PE6, PE7, PE8, and PE9 may include three or less of the second sub-pad electrodes PE6, PE7, PE8, and PE9. At least one of the second sub-pad electrodes PE6, PE7, PE8, and PE9 may be electrically connected to at least one of the second driving electrodes OE4, OE5, OE6, and OE7.

The fourth pad electrodes PE10, PE11, PE12, and PE13 may include at least one of the third sub-pad electrodes PE10, PE11, PE12, and PE13 arranged to be spaced apart from each other in the fourth pad region a8. For example, the fourth pad electrodes PE10, PE11, PE12, and PE13 may include a third-1 sub-pad electrode PE10, a third-2 sub-pad electrode PE11, a third-3 sub-pad electrode PE12, and a third-4 sub-pad electrode PE13, which are provided to be spaced apart from each other in the fourth pad region a8. However, the embodiments are not limited thereto, and the fourth pad electrodes PE10, PE11, PE12, and PE13 may include five or more third sub-pad electrodes PE10, PE11, PE12, and PE13. In addition, the fourth pad electrodes PE10, PE11, PE12, and PE13 may include three or less of the third sub-pad electrodes PE10, PE11, PE12, and PE13. At least one of the third sub-pad electrode PE10, PE11, PE12, and PE13 may be electrically connected to at least one of the fourth driving electrodes OE8 and OE9 except for the second dummy electrodes DE3 and DE4.

The first pad region a3 may be a central region of an upper surface of the first electronic device 22, and the second pad region a4 may be a region surrounding the first pad region a3. In addition, the third pad region a7 may be a region surrounding the second pad region a4, and the fourth pad region a8 may be a region surrounding the third pad region a7.

In this case, at least one second sub-pad electrode PE6, PE7, PE8, and PE9 provided in the third pad region a7 may be arranged to surround at least one first sub-pad electrode PE2, PE3, PE4, and PE5 provided in the second pad region a4. In addition, at least one third sub-pad electrode PE10, PE11, PE12, and PE13 provided in the fourth pad region a8 may be arranged to surround at least one second sub-pad electrode PE6, PE7, PE8, and PE9 provided in the third pad region a7.

Referring to FIG. 8, the second-1 sub-pad electrode PE6, the second-2 sub-pad electrode PE7, the second-3 sub-pad electrode PE8, and the second-4 sub-pad electrode PE9 may be sequentially arranged in a counter-clockwise direction around the first pad electrode PE1. For example, the second-1 sub-pad electrode PE6 and the second-3 sub-pad electrode PE8 may be arranged opposite to each other in a vertical direction (e.g., x-direction) with the first pad electrode PE1 interposed therebetween. In addition, the second-2 sub-pad electrode PE7 and the second-4 sub-pad electrode PE9 may be arranged opposite to each other in a horizontal direction with the first pad electrode PE1 interposed therebetween.

Referring to FIG. 8, the third-1 sub-pad electrode PE10, the third-4 sub-pad electrode PE13, the third-2 sub-pad electrode PE11, and the third-3 sub-pad electrode PE12 may be sequentially arranged in a counter-clockwise direction around the first pad electrode PE1. For example, the third-1 sub-pad electrode PE10 and the third-2 sub-pad electrode PE11 may be arranged opposite to each other in the first diagonal direction with the first pad electrode PE1 interposed therebetween. In addition, the third-3 sub-pad electrode PE12 and the third-4 sub-pad electrode PE13 may be arranged opposite to each other in a second diagonal direction crossing the first diagonal direction with the first pad electrode PE1 interposed therebetween.

In this case, the plurality of pad electrodes PE1, PE2, PE3, PE4, PE5, PE6, PE7, PE8, PE9, PE10, PE11, PE12, and PE13 may be arranged on the upper surface of the first electronic device 22 to be x-axis symmetrical and y-axis symmetrical. For example, lines connecting the center points of the second-1 sub-pad electrode PE6, the second-2 sub-pad electrode PE7, the second-3 sub-pad electrode PE8, and the second-4 sub-pad electrode PE9 may form a rhombus or a square. In addition, lines connecting the center points of the third-1 sub-pad electrode PE10, the third-3 sub-pad electrode PE12, the third-2 sub-pad electrode PE11, and the third-4 sub-pad electrode PE13 may form a rectangular or square shape.

Figure 9:
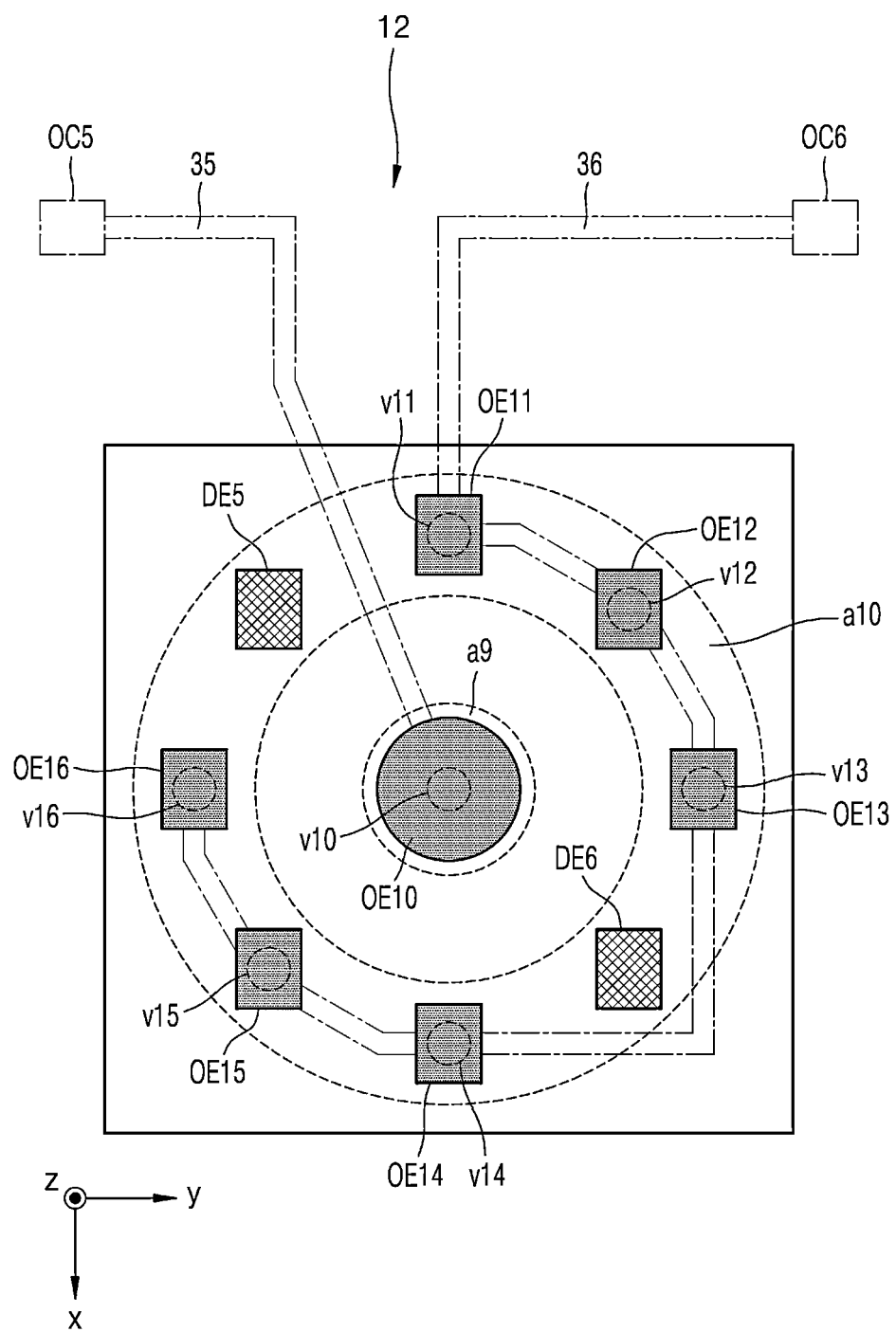
FIG. 9 illustrates a driving circuit board on which a plurality of driving electrodes are arranged on a first driving electrode region among a plurality of driving electrode regions according to another embodiment.
Figure 10:
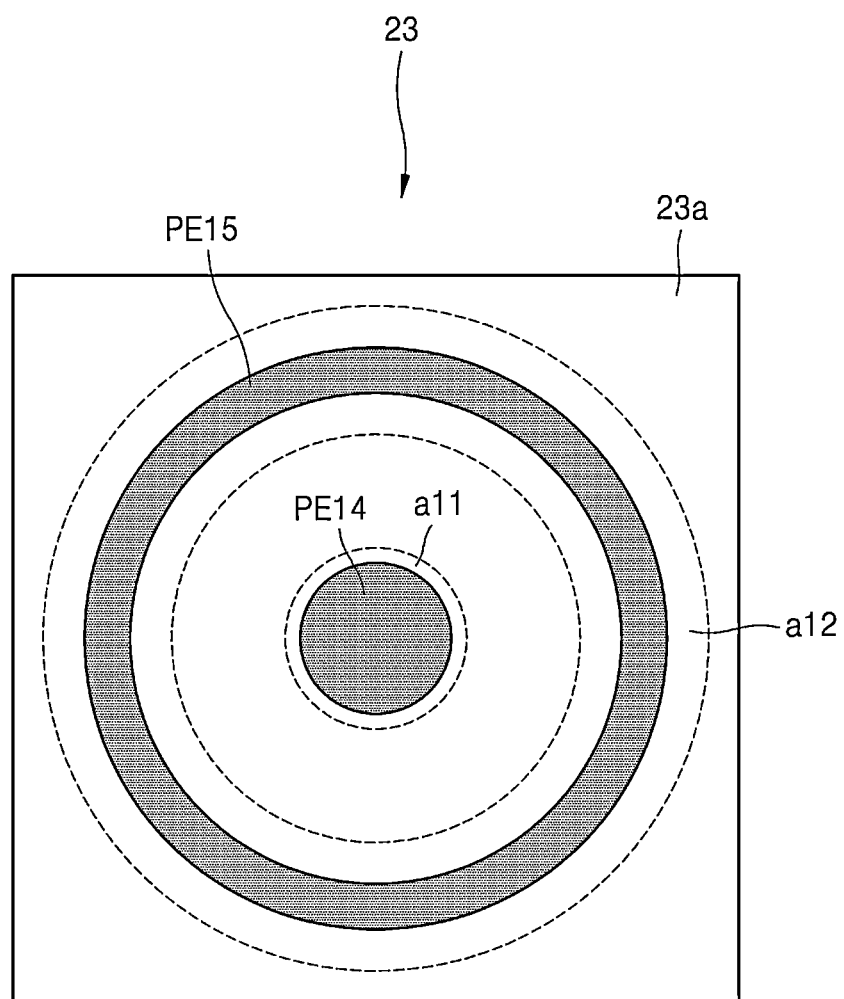
FIG. 10 illustrates a plurality of pad electrodes arranged on a first electronic device according to another embodiment.

FIG. 9 illustrates a state in which a plurality of driving electrodes OE10, OE11, OE12, OE13, OE14, OE15, OE16, DE5, and DE6 are arranged in a first driving electrode region among a plurality of driving electrode regions on a driving circuit board 12 according to another embodiment. FIG. 10 illustrates a state in which a plurality of pad electrodes PE14 and PE15 are arranged on a first electronic device 23 among a plurality of electronic devices according to another embodiment.

Similar to the driving circuit board 10 of FIG. 1, a plurality of driving electrode regions may be provided on the driving circuit board 12 of FIG. 9. A configuration of any first driving electrode region among a plurality of driving electrode regions of the driving circuit board 12 is shown in FIG. 9.

A plurality of electronic devices may be transferred to each of the plurality of driving electrode regions of the driving circuit board 12. An example of a configuration of any first electronic device 23 among a plurality of electronic devices transferred to the driving circuit board 12 is shown in FIG. 10.

Referring to FIG. 9, a plurality of driving electrodes OE10, OE11, OE12, OE13, OE14, OE15, OE16, DE5, and DE6 may be symmetrically arranged in the first driving electrode region of the first driving circuit board 12. For example, the arrangement of the plurality of driving electrodes OE10, OE11, OE12, OE13, OE14, OE15, OE16, DE5, and DE6 may have radial symmetry.

Referring to FIG. 9, the first driving electrode region of the driving circuit board 12 may include a first sub-driving electrode region a9 and a second sub-driving electrode region a10 different from the first sub-driving electrode region a9. The plurality of driving electrodes OE10, OE11, OE12, OE13, OE14, OE15, OE16, DE5, and DE6 provided in the first drive electrode region of the first drive circuit board 12 may include the first driving electrode OE10 provided in the first sub-driving electrode region a9 and the second driving electrodes OE11, OE12, OE13, OE14, OE15, OE16, DE5, and DE6 provided in the second sub-driving electrode region a10. The second driving electrodes OE11, OE12, OE13, OE14, OE15, OE16, DE5 and DE6 may be formed to be electrically disconnected to the first driving electrode OE10.

The first driving electrode OE10 may be a single electrode arranged in the first sub-driving electrode region a9. However, the embodiments are not limited thereto, and unlike FIG. 9, the first driving electrode OE10 may include a plurality of sub-driving electrodes spaced apart from each other in the first sub-driving electrode region a9.

The first driving electrode OE10 may be electrically connected to the first-1 driving circuit OC5. For example, the first driving electrode OE10 may be electrically connected to the first conductive wiring 35 electrically connected to the first-1 driving circuit OC5 through a first via v10 formed at a center thereof.

The second driving electrode OE11, OE12, OE13, OE14, OE15, OE16, DE5, and DE6 may include at least one first sub-driving electrode OE11, OE12, OE13, OE14, OE15, and OE16 and at least one first dummy electrode DE5 and DE6, which are arranged to be spaced apart from each other in the second sub-driving electrode region a10. For example, the second driving electrodes OE11, OE12, OE13, OE14, OE15, OE16, DE5, and DE6 may further include a first-1 sub-driving electrode OE11, a first-2 sub-driving electrode OE12, a first-3 sub-driving electrode OE13, a first-4 sub-driving electrode OE14, a first-5 sub-driving electrode OE15, a first-6 sub-driving electrode OE16, a first-1 dummy electrode DE5, and a first-2 dummy electrode DE6, which are provided to be spaced apart from each other in the second sub-driving electrode region a10. However, the embodiments are not limited thereto, and the second driving electrodes OE11, OE12, OE13, OE14, OE15, OE16, DE5, and DE6 may include seven or more of first sub-driving electrodes OE11, OE12, OE13, OE14, OE15, and OE16 and three or more of first dummy electrodes DE5 and DE6. In addition, the second driving electrode OE11, OE12, OE13, OE14, OE15, OE16, DE5, and DE6 may include five or less of the first sub-driving electrodes OE11, OE12, OE13, OE14, OE15, and OE16, and one of the first dummy electrodes DE5 and DE6.

At least one of the first sub-driving electrodes OE11, OE12, OE13, OE14, OE15, and OE16 may be electrically connected to the first-2 driving circuit OC6. Unlike, the at least one of the first dummy electrodes DE5 and DE6 may not be electrically connected to the first-2 driving circuit OC6.

For example, the first-1 sub-driving electrode OE11 may be electrically connected to the second conductive wiring 36 electrically connected to the first-2 driving circuit OC6 through a second via v11 formed at a center thereof. The first-2 sub-driving electrode OE12 may be electrically connected to the second conductive wiring 36 electrically connected to the first-2 driving circuit OC6 through a third via v12 formed at a center thereof. The first-3 sub-driving electrode OE13 may be electrically connected to the second conductive wiring 36 electrically connected to the first-2 driving circuit OC6 through a fourth via v13 formed at a center thereof. The first-4 sub-driving electrode OE14 may be electrically connected to the second conductive wiring 36 electrically connected to the first-2 driving circuit OC6 through a fifth via v14 formed at a center thereof. The first-5 sub-driving electrode OE15 may be electrically connected to the second conductive wiring 36 electrically connected to the first-2 driving circuit OC6 through a sixth via v15 formed at a center thereof. The first-6 sub-driving electrode OE16 may be electrically connected to the second conductive wiring 36 electrically connected to the first-2 driving circuit OC6 through a seventh via v16 formed at a center thereof.

In this way, the at least one of the first sub-driving electrodes OE11, OE12, OE13, OE14, OE15, OE16, DE5, and DE6 included in the second driving electrode OE11, OE12, OE13, OE14, OE15, OE16, DE5, and DE6 may be electrically connected to the first-2 driving circuit OC6 through a second conductive wiring 36.

The first-1 dummy electrode DE5 and the first-2 dummy electrode DE6 may not be electrically connected to the first-2 driving circuit OC6. In addition, the first-1 dummy electrode DE5 and the first-2 dummy electrode DE6 may be electrically disconnected to at least one first sub-driving electrode OE11, OE12, OE13, OE14, OE15, and OE16 included in the second driving electrode OE11, OE12, OE13, OE14, OE15, OE16, DE5, and DE6. Accordingly, the electrical signals applied from the first-2 driving circuit OC6 to the at least one of the first sub-driving electrodes OE11, OE12, OE13, OE14, OE15, and OE16 may not be transferred to the first-1 dummy electrode DE5 and the first-2 dummy electrode DE6.

As described above with reference to FIG. 9, the first driving electrode OE10 among the plurality of driving electrodes OE10, OE11, OE12, OE13, OE14, OE15, OE16, DE5, and DE6 may be electrically connected to the first-1 driving circuit OC5. In addition, the first-1 sub-driving electrode OE11, the first-2 sub-driving electrode OE12, the first-3 sub-driving electrode OE13, the first-4 sub-driving electrode OE14, the first-5 sub-driving electrode OE15, and the first-6 sub-driving electrode OE16 may be electrically connected to the first-2 driving circuit OC6.

Further, the first-1 dummy electrode DE5 and the first-2 dummy electrode DE6 which are the remaining parts except for a first driving electrode OE10, a first-1 sub-driving electrode OE11, a first-2 sub-driving electrode OE12, a first-3 sub-driving electrode OE13, a first-4 sub-driving electrode OE14, a first-5 sub-driving electrode OE15, and a first-6 sub-driving electrode OE16, from among the plurality of driving electrodes OE10, OE11, OE12, OE13, OE14, OE15, OE16, DE5, and DE6 may not be electrically connected to the first driving circuit OC5 or the second driving circuit OC6.

The first sub-driving electrode region a9 may be a central region of the first driving electrode region of the driving circuit board 12, and the second sub-driving electrode region a10 may be a region surrounding the first sub-driving electrode region a9. For example, the first sub-driving electrode region a9 may be circular, and the second sub-driving electrode region a10 may be a ring shape surrounding the first sub-driving electrode region a9.

In this case, the second driving electrode OE11, OE12, OE13, OE14, OE15, OE16, DE5, and DE6 provided in the second sub-driving electrode region a10 may be arranged to surround the first driving electrode OE10 provided in the first sub-driving electrode region a9. Although FIG. 9 shows that there is a predetermined gap between the first sub-driving electrode region a9 and the second sub-driving electrode region a10, this is exemplary, and the first sub-driving electrode region a9 and the second sub-driving electrode region a10 may directly contact each other.

For example, a first-1 dummy electrode DE5, a first-1 sub-driving electrode OE11, a first-2 sub-driving electrode OE12, a first-3 sub-driving electrode OE13, a first-2 dummy electrode DE6, a first-4 sub-driving electrode OE14, a first-5 sub-driving electrode OE15, and a first-6 sub-driving electrode OE16 may be sequentially arranged in a clockwise direction around the first driving electrode OE10. In this case, the plurality of driving electrodes OE10, OE11, OE12, OE13, OE14, OE15, OE16, DE5, and DE6 may be arranged in the first driving electrode region of the driving circuit board 12 to be x-axis symmetrical and y-axis symmetrical. For example, lines of connecting the center points of the first-1 dummy electrode DE5, the first-1 sub-driving electrode OE11, the first-2 sub-driving electrode OE12, the first-3 sub-driving electrode OE13, the first-2 dummy electrode DE6, the first-4 sub-driving electrode OE14, the first-5 sub-driving electrode OE15, and the first-6 sub-driving electrode OE16 may form a circle.

Referring to FIG. 10, the third surface 23a of the first electronic device 23 may include a first pad region a11 and a second pad region a12 different from the first pad region a11. The plurality of pad electrodes PE14 and PE15 provided on the third surface 23a of the first electronic device 23 may include the first pad electrode PE14 provided in the first pad region a11 and the second pad electrode PE15 provided in the second pad region a12. The second pad electrode PE15 may be formed to be electrically disconnected with respect to the first pad electrode PE14.

The first pad region a11 and the second pad region a12 may correspond to the first sub-driving electrode region a9 and the second sub-driving electrode region a10, respectively. For example, the first sub-driving electrode region a9 and the first pad region a11 may correspond to each other, and the second sub-driving electrode region a10 and the second pad region a12 may correspond to each other. Accordingly, when the first electronic device 23 is transferred into the first driving electrode region of the driving circuit board 12, the first driving electrode OE10 provided in the first sub-driving electrode region a9 may be electrically connected to the first pad electrode PE14 provided in the first pad region a11. In addition, when the first electronic device 23 is transferred into the first driving electrode region of the driving circuit board 12, the second driving electrodes OE11, OE12, OE13, OE14, OE15, DE5, and DE6 provided in the second sub-driving electrode region a10 may be electrically connected to the second pad electrode PE15 provided in the second pad region a12.

The first pad electrode PE14 may be a single electrode arranged in the first pad region a11. However, the embodiments are not limited thereto, and unlike FIG. 10, the first pad electrode PE14 may include a plurality of sub-pad electrodes arranged to be spaced apart from each other in the first pad region a11.

The second pad electrode PE15 may be a single electrode arranged in the second pad region a12. For example, the second pad electrode OE15 may have a ring shape surrounding the first pad electrode PE14. However, the embodiments are not limited thereto, and unlike FIG. 10, the second pad electrode PE15 may include a plurality of sub-pad electrodes arranged to be spaced apart from each other in the second pad region a12.

The first pad region a11 may be a central region of the third surface 23a of the first electronic device 23, and the second pad region a12 may be a region surrounding the first pad region a13. For example, the first pad region a11 may be circular, and the second pad region a12 may be a ring-shaped surrounding the first pad region a11.

In this case, the second pad electrode PE15 provided in the second pad region a12 may be arranged to surround the first pad electrode PE14 provided in the first pad region a11. Although FIG. 10 illustrates that there is a predetermined gap between the first pad region a11 and the second pad region a12, this is exemplary, and the first pad region a11 and the second pad region a12 may directly contact each other.

Figure 11:
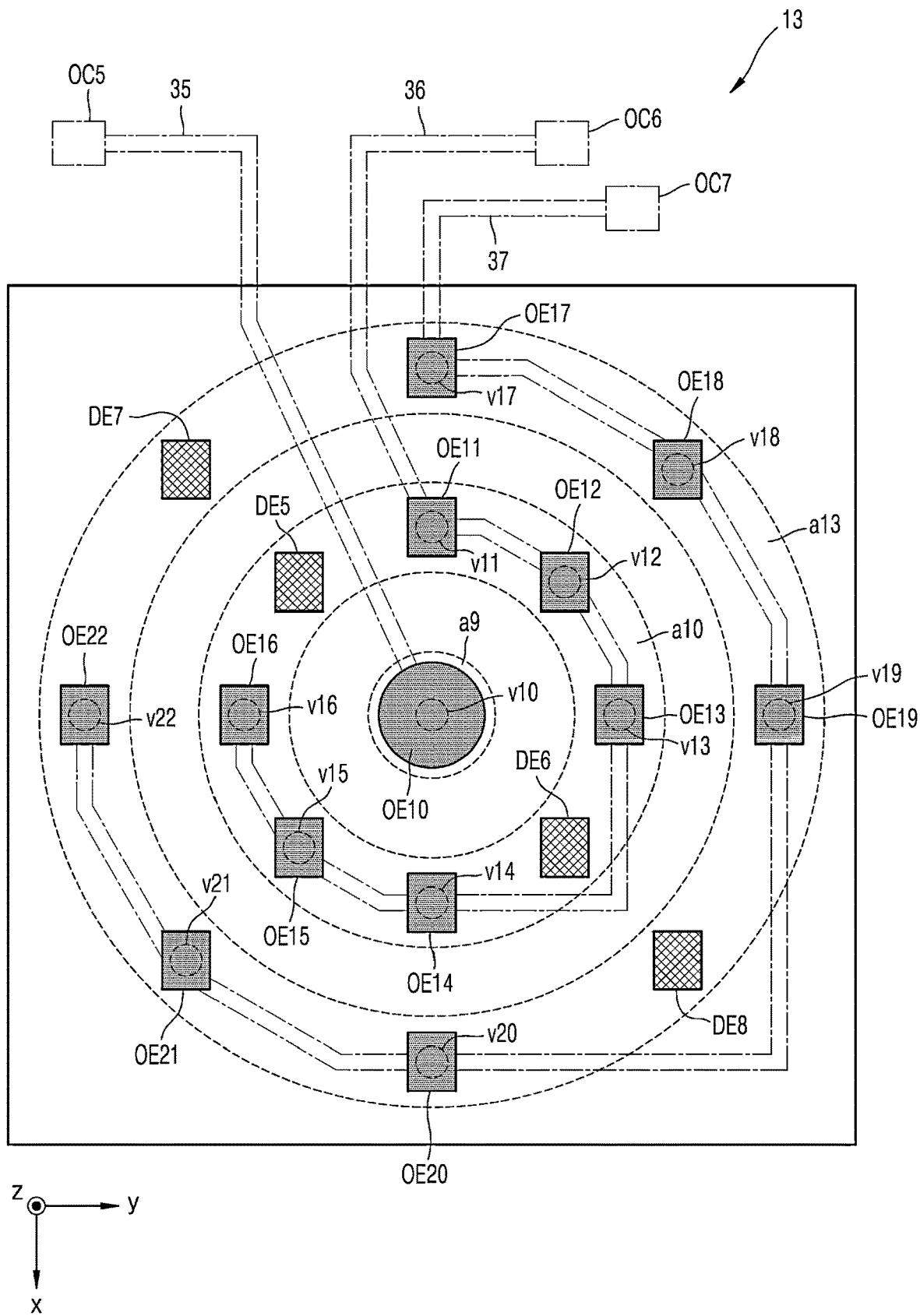
FIG. 11 illustrates a driving circuit board on which a plurality of driving electrodes are arranged on a first driving electrode region among a plurality of driving electrode regions according to another embodiment.
Figure 12:
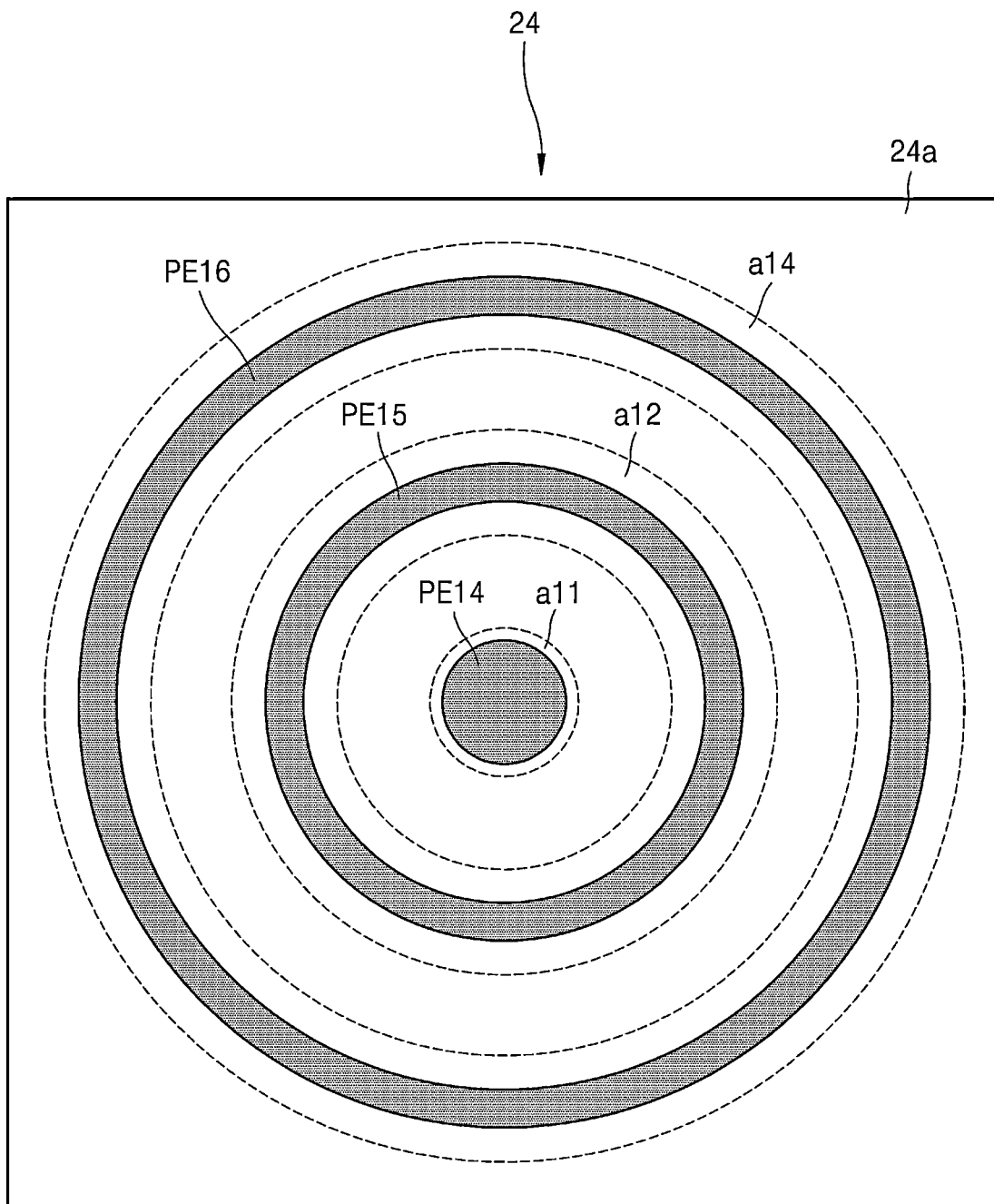
FIG. 12 illustrates a plurality of pad electrodes arranged on a first electronic device according to another embodiment.
Figure 13:
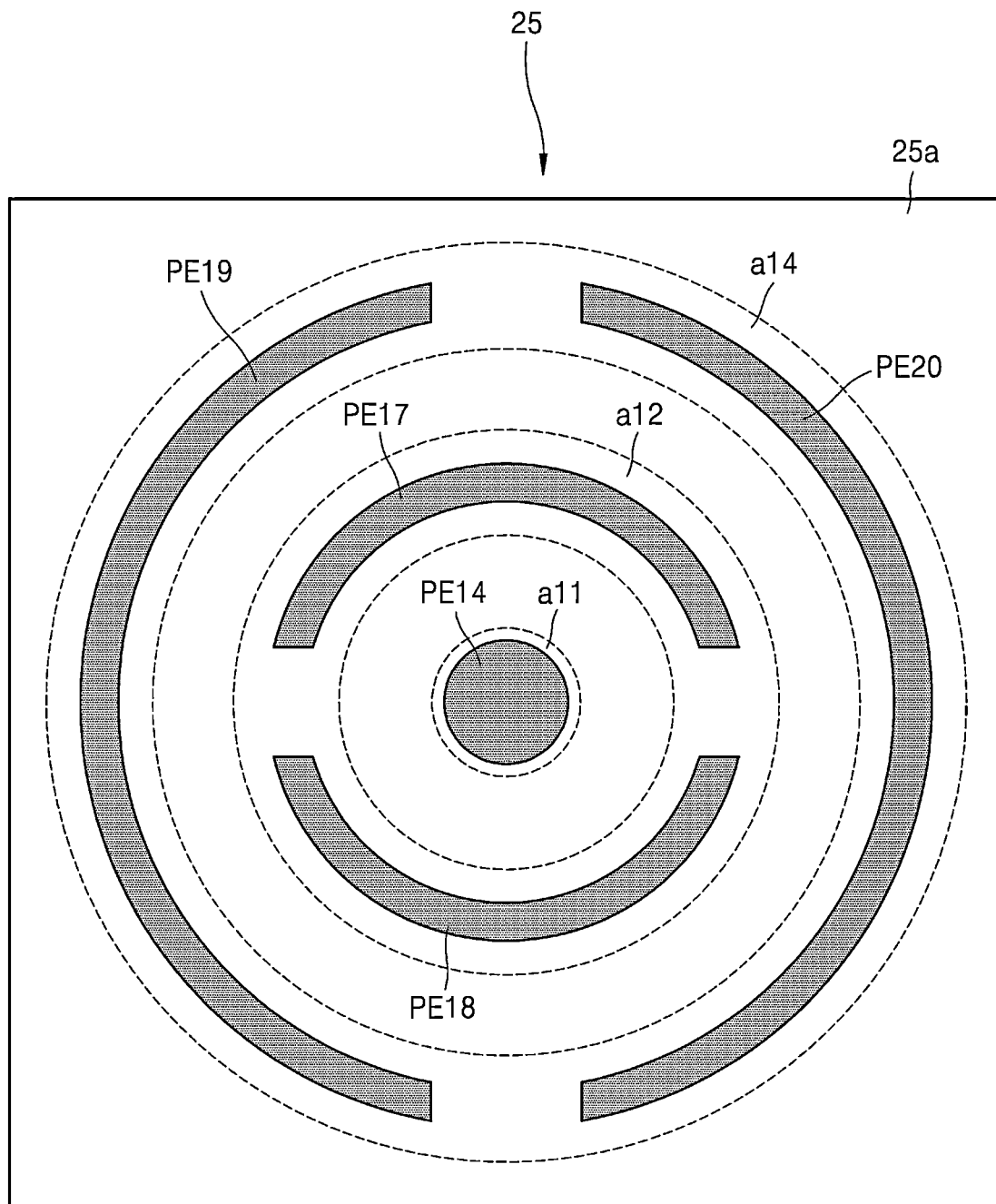
FIG. 13 illustrates a plurality of pad electrodes arranged on a first electronic device according to another embodiment.

FIG. 11 illustrates a state in which a plurality of driving electrodes OE10, OE11, OE12, OE13, OE14, OE15, OE16, OE17, OE18, OE19, OE20, OE21, OE22, DE5, DE6, DE7, and DE8 are arranged in the first driving electrode region, among a plurality of driving electrode regions on the driving circuit board 13 according to another embodiment. FIG. 12 illustrates a state in which a plurality of pad electrodes PE14, PE15, and PE16 are arranged on a first electronic device 24 among a plurality of electronic devices according to another embodiment. FIG. 13 illustrates a state in which a plurality of pad electrodes PE14, PE17, PE18, PE19, and PE20 are arranged on a first electronic device 25 among a plurality of electronic devices according to another embodiment.

The state in which the plurality of driving electrodes OE10, OE11, OE12, OE13, OE14, OE15, OE16, OE17, OE18, OE19, OE20, OE21, OE22, DE5, DE6, DE7, and DE8 are arranged in the first driving electrode region of the driving circuit board 13 of FIG. 11 may be substantially the same as a state in which the plurality of driving electrodes OE10, OE11, OE12, OE13, OE14, OE15, OE16, DE5, and DE6 are arranged in the first driving electrode region of the driving circuit board 12 of FIG. 9, except that the third sub-driving electrode region a13 surrounding the first sub-driving electrode region a9 and the second sub-driving electrode region a10 is further included. In the description of FIG. 11, the duplicated description of FIG. 9 is omitted.

The state in which the plurality of pad electrodes PE14, PE15, and PE16 are arranged on the first electronic device 24 of FIG. 12 may be substantially the same as a state in which the plurality of pad electrodes PE14 and PE15 are arranged on the first electronic device 23 of FIG. 10, except that the third pad region a14 surrounding the first pad region a11 and the second pad region a12 is further included. In the description of FIG. 12, the duplicated description of FIG. 10 is omitted.

The state in which the plurality of pad electrodes PE14, PE17, PE18, PE19, and PE20 are arranged on the first electronic device 25 of FIG. 13 may be substantially the same as a state in which the plurality of pad electrodes PE14, PE15, and PE16 are arranged in the first electronic device 24 of FIG. 12, except that the second pad electrodes PE17 and PE18 and the third pad electrodes PE19 and PE20 arranged in the second pad region a12 and the third pad region a14 are different from the second pad electrode PE15 and the third pad electrode PE16 of FIG. 12, in view of the configurations thereof. In the description of FIG. 13, the duplicated description of FIG. 12 is omitted.

Referring to FIG. 11, the first driving electrode region of the driving circuit board 13 may include a first sub-driving electrode region a9 and a second sub-driving electrode region a10 different from the first sub-driving electrode region a9. In addition, the first driving electrode region of the driving circuit board 13 may further include first and second sub-driving electrode regions a9 and a10, and a third sub-driving electrode region a13 different from the first and second sub-driving electrode regions a9 and a10.

The plurality of driving electrodes OE10, OE11, OE12, OE13, OE14, OE15, OE16, OE17, OE18, OE19, OE20, OE21, OE22, DE5, DE6, DE7, and DE8 provided in the first driving electrode region of the driving circuit board 13 may include the first driving electrode OE10 provided in the first sub-driving electrode region a9 and the second driving electrodes OE10, OE11, OE12, OE13, OE14, OE15, OE16, DE5, and DE6 provided in the second sub-driving electrode region a10. The second driving electrodes OE10, OE11, OE12, OE13, OE14, OE15, OE16, DE5 and DE6 may be formed to be electrically disconnected to the first driving electrode OE10. The first driving electrode OE10 may be electrically connected to the first-1 driving circuit OC5, and the first-1 sub-driving electrode OE11, the first-2 sub-driving electrode OE12, the first-3 sub-driving electrode OE13, the first-4 sub-driving electrode OE14, the first-5 dub-driving electrode OE15, and the first-6 sub-driving electrode OE16 included in the second driving electrodes OE10, OE11, OE12, OE13, OE14, OE15, OE16, DE5, and DE6 may be electrically connected to the first-2 driving electrode OC6.

In addition, the plurality of driving electrodes OE10, OE11, OE12, OE13, OE14, OE15, OE16, OE17, OE18, OE19, OE20, OE21, OE22, DE5, DE6, DE7, and DE8 provided in the first driving electrode region of the driving circuit board 13 may include the third driving electrodes OE17, OE18, OE19, OE20, OE21, OE22, DE7, and DE8 provided in the third sub-driving electrode region a13. The third driving electrodes OE17, OE18, OE19, OE20, OE21, OE22, DE7, and DE8 may be formed to be electrically disconnected with respect to the first and second driving electrodes OE10, OE11, OE12, OE13, OE14, OE15, OE16, DE5, and DE6.

The third driving electrodes OE17, OE18, OE19, OE20, OE21, OE22, DE7, and DE8 may include at least one second sub-driving electrode OE17, OE18, OE19, OE20, and OE21 and at least one second dummy electrode DE7 and DE8, which are arranged to be spaced apart from each other in the third sub-driving electrode region a13. For example, the third driving electrodes OE17, OE18, OE19, OE20, OE21, and OE22 may include a second-1 sub-driving electrode OE17, a second-2 sub-driving electrode OE18, a second-3 sub-driving electrode OE19, a second-4 sub-driving electrode OE20, a second-5 sub-driving electrode OE21, a second-6 sub-driving electrode OE22, a second-1 dummy electrode DE7, and a second-2 dummy electrode DE8, which are provided to be space d apart from each other in the third sub-driving electrode region a13. However, the embodiments are not limited thereto, and the third driving electrodes OE17, OE18, OE19, OE20, OE21, OE22, DE7, and DE8 may include seven or more of second sub-driving electrodes OE17, OE18, OE19, OE20, OE21, and OE22, and three or more of second dummy electrodes DE7, DE8. In addition, the third driving electrodes OE17, OE18, OE19, OE20, OE21, OE22, DE7, and DE8 may include five or less of the third sub-driving electrodes OE17, OE19, OE20, OE21, and OE22 and one of the second dummy electrodes DE7 and DE8.

At least one of the third sub-driving electrodes OE17, OE18, OE19, OE20, OE21, and OE22 may be electrically connected to the first-3 driving circuit OC7. Unlike, the at least one of the second dummy electrodes DE3 and DE4 may not be electrically connected to the first-3 driving circuit OC3.

For example, the second-1 sub-driving electrode OE17 may be electrically connected to the third conductive wiring 37 electrically connected to the first-3 driving circuit OC3 through an eighth via v17 formed at a center thereof. The second-2 sub-driving electrode OE18 may be electrically connected to the third conductive wiring 37 electrically connected to the first-3 driving circuit OC3 through a ninth via v18 formed at a center thereof. The second-3 sub-driving electrode OE19 may be electrically connected to the third conductive wiring 37 electrically connected to the first-3 driving circuit OC3 through a tenth via v19 formed at a center thereof. The second-4 sub-driving electrode OE20 may be electrically connected to the third conductive wiring 37 electrically connected to the first-3 driving circuit OC3 through an eleventh via v20 formed at a center thereof. The second-5 sub-driving electrode OE21 may be electrically connected to the third conductive wiring 37 electrically connected to the first-3 driving circuit OC3 through a twelfth via v21 formed at a center thereof. The second-6 sub-driving electrode OE22 may be electrically connected to the third conductive wiring 37 electrically connected to the first-3 driving circuit OC3 through a thirteenth via v22 formed at a center thereof.

As such, at least one of the second sub-driving electrodes OE17, OE18, OE19, OE20, OE21, and OE22 included in the third driving electrodes OE17, OE18, OE19, OE20, OE21, OE22, DE7, and DE8 may be electrically connected to the first-3 driving circuit OC3 through a third conductive wiring 37.

The second-1 dummy electrode DE7 and the second-2 dummy electrode DE8 may not be electrically connected to the first-3 driving circuit OC7. In addition, the second-1 dummy electrode DE7 and the second-2 dummy electrode DE8 may be electrically disconnected to at least one of the second sub-driving electrode OE17, OE18, OE19, OE20, OE21, and OE22 included in the third driving electrodes OE17, OE18, OE19, OE20, OE21, OE22, DE7, and DE8. Accordingly, the electrical signals applied from the first-3 driving circuit OC7 to the at least one of the second sub-driving electrodes OE17, OE18, OE19, OE20, OE21, and OE22 may not be transferred to the second-1 dummy electrode DE7 and the second-2 dummy electrode DE8.

As described with reference to FIG. 11, among the plurality of driving electrodes OE10, OE11, OE12, OE13, OE14, OE15, OE16, OE17, OE18, OE19, OE20, OE21, OE22, DE5, DE6, DE7, and DE8, the second-1 sub-driving electrode OE17, the second-2 sub-driving electrode OE18, the second-3 sub-driving electrode OE19, the second-4 sub-driving electrode OE20, the second-5 sub-driving electrode OE21, and the second-6 sub-driving electrode OE22 may be electrically connected to the first-3 driving circuit OC7.

Furthermore, the second-1 dummy electrode DE7 and the second-2 dummy electrode DE8 which are the remaining parts except for the first driving electrode OE10, the second driving electrodes OE11, OE12, OE13, OE14, OE15, and OE16, the second-1 sub-driving electrode OE17, the second-2 sub-driving electrode OE18, the second-3 sub-driving electrode OE19, the second-4 sub-driving electrode OE20, the second-5 sub-driving electrode OE21, and the second-6 sub-driving electrode OE22 from among the plurality of driving electrodes OE10, OE11, OE12, OE13, OE14, OE15, OE16, OE17, OE18, OE19, OE20, OE21, OE22, DE5, DE6, DE7, and DE8, may not be electrically connected to the first driving circuit OC5, the second driving circuit OC6 or the third driving circuit OC7.

The third sub-driving electrode region a13 may be a region surrounding the second sub-driving electrode region a10. For example, the third sub-driving electrode region a13 may have a ring shape surrounding the second sub-driving electrode region a10.

In this case, the third driving electrodes OE17, OE18, OE19, OE20, OE21, OE22, DE7, and DE8 provided in the third sub-driving electrode region a13 may be arranged to surround the second driving electrodes OE11, OE12, OE13, OE15, OE18, DE5, and DE6 provided in the second sub-driving electrode region a10. Although FIG. 11 shows that there is a predetermined gap between the second sub-driving electrode region a10 and the third sub-driving electrode region a13, this is exemplary, and the second sub-driving electrode region a10 and the third sub-driving electrode region a13 may directly contact each other.

For example, a second-1 dummy electrode DE7, a second-1 sub-driving electrode OE17, a second-2 sub-driving electrode OE18, a second-3 sub-driving electrode OE19, a second-2 dummy electrode DE8, a second-4 sub-driving electrode OE20, a second-5 sub-driving electrode OE21, and a second-6 sub-driving electrode OE22 may be sequentially arranged in a clockwise direction around the first driving electrode OE10. In this case, the plurality of driving electrodes OE10, OE11, OE12, OE13, OE14, OE15, OE16, OE17, OE18, OE19, OE20, OE21, OE22, DE5, DE6, DE7, and DE8 may be x-axis symmetrically and y-axis symmetrically arranged in the first driving electrode region of the driving circuit board 13. For example, lines of connecting the center points of the second-1 dummy electrode DE7, the second-1 sub-driving electrode OE17, the second-2 sub-driving electrode OE18, the second-3 sub-driving electrode OE19, the second-2 dummy electrode DE8, the second-4 sub-driving electrode OE20, the second-5 sub-driving electrode OE21, and the second-6 sub-driving electrode OE22 may form a circle.

Referring to FIG. 12, the third surface 23a of the first electronic device 24 may include a first pad region a11 and a second pad region a12 different from the first pad region a11. In addition, the third surface 24a of the first electronic device 24 may further include a third pad region a14 different from the first and second pad regions a11 and a12.

The plurality of pad electrodes PE14, PE15, and PE16 provided on the third surface 24a of the first electronic device 24 may include a first pad electrode PE14 provided in the first pad region a11, a second pad electrode PE15 provided in the second pad region a12, and a third pad electrode PE16 provided in the third pad region a14. The second pad electrode PE15 may be formed to be electrically disconnected with respect to the first pad electrode PE14. The third pad electrode PE16 may be formed to be electrically disconnected with respect to the first and second pad electrodes PE14 and PE15.

The third pad region a14 may correspond to the third sub-driving electrode region a13. Accordingly, when the first electronic device 24 is transferred in the first driving electrode region of the driving circuit board 13, the third driving electrodes OE17, OE18, OE19, OE20, OE21, OE22, DE7, and DE8 provided in the first sub-driving electrode region a13 may be electrically connected to the third pad electrode PE16 provided in the third pad region a14.

The third pad electrode PE16 may be a single electrode arranged in the third pad region a14. For example, the third pad electrode OE16 may have a ring shape surrounding the second pad electrode PE15. However, the embodiments are not limited thereto, and unlike FIG. 12, the third pad electrode PE16 may include a plurality of sub-pad electrodes arranged to be spaced apart from each other in the third pad region a14.

The third pad region a14 may be a region surrounding the second pad region a12. For example, the third pad region a14 may have a ring shape surrounding the second pad region a12.

In this case, the third pad electrode PE16 provided in the third pad region a14 may be arranged to surround the second pad electrode PE15 provided in the second pad region a12. Although FIG. 12 illustrates that there is a predetermined gap between the second pad region a12 and the third pad region a14, this is exemplary, and the second pad region a12 and the third pad region a14 may directly contact each other Referring to FIG. 13, the third surface 25a of the first electronic device 25 may include a first pad region a11 and a second pad region a12 different from the first pad region a11. In addition, the third surface 25a of the first electronic device 25 may further include a third pad region a14 different from the first and second pad regions a11 and a12.

The plurality of pad electrodes PE14, PE17, PE18, PE19, and PE20 provided on the third surface 25a of the first electronic device 24 may include the first pad electrode PE14 provided in the first pad region a11, second pad electrodes PE17 and PE18 provided in the second pad region a12, and third pad electrodes PE19 and PE20 provided in the third pad region a14. The second pad electrodes PE17 and PE18 may be formed to be electrically disconnected with respect to the first pad electrode PE14. The second pad electrodes PE19 and PE20 may be formed to be electrically disconnected with respect to the first and second pad electrodes PE14, PE17 and PE18.

The second pad electrodes PE17 and PE18 may include a plurality of first sub-pad electrodes PE17 and PE18 arranged to be spaced apart from each other in the third pad region a14. For example, the second pad electrodes PE17 and PE18 may include a first-1 sub-pad electrode PE17 and a first-2 sub-pad electrode PE18, which are semicircular. The first-1 sub-pad electrode PE17 and the first-2 sub-pad electrode PE18 may be opposite each other in the vertical direction (e.g., x-direction) with the first pad electrode PE14 interposed therebetween. However, the embodiments are not limited thereto, and the first-1 sub-pad electrode PE17 and the first-2 sub-pad electrode PE18 may be opposite each other in a horizontal direction (e.g., y-direction) with the first pad electrode PE14 interposed therebetween.

The third pad electrodes PE19 and PE20 may include a plurality of second sub-pad electrodes PE19 and PE20 arranged to be spaced apart from each other in the third pad region a14. For example, the third pad electrodes PE19 and PE20 may include a second-1 sub-pad electrode PE19 and a second-2 sub-pad electrode PE20, which are semicircular. The second-1 sub-pad electrode PE19 and the second-2 sub-pad electrode PE20 may be opposite each other in the horizontal direction (e.g., y-direction) with the first pad electrode PE14 interposed therebetween. However, the embodiments are not limited thereto, and the second-1 sub-pad electrode PE19 and the second-2 sub-pad electrode PE20 may be opposite each other in a vertical direction (e.g., x-direction) with the first pad electrode PE14 interposed therebetween.

Figure 14:
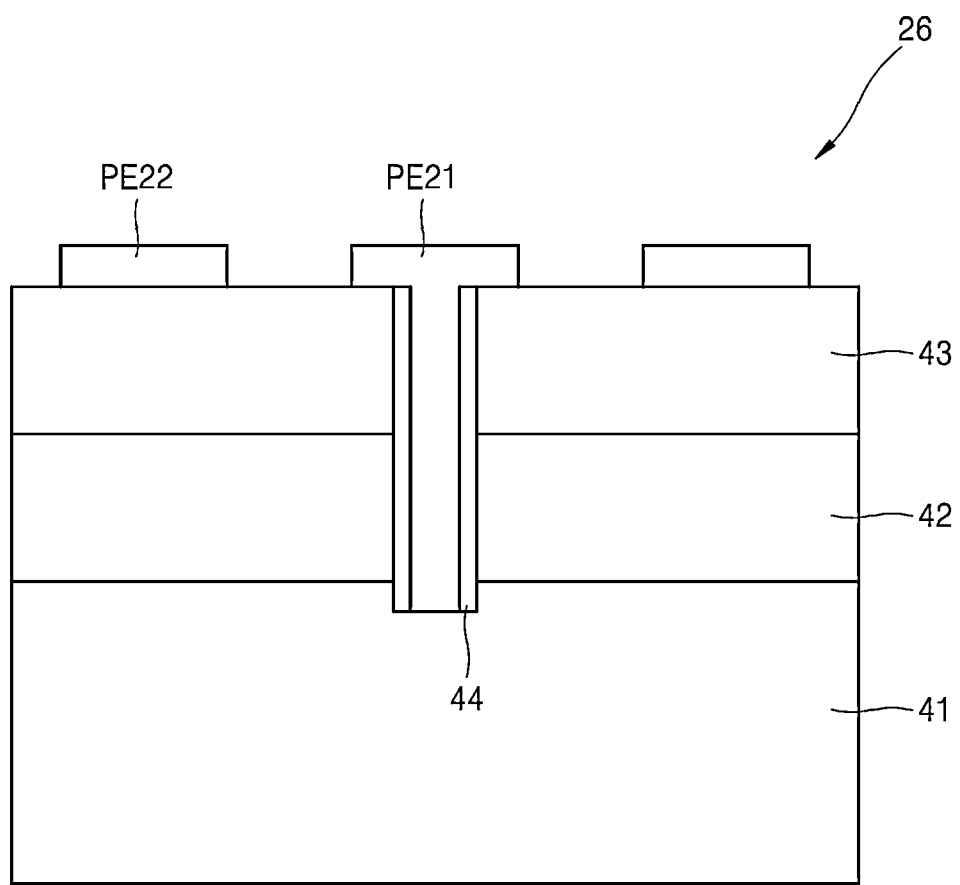
FIG. 14 illustrates an example configuration of a first electronic device among a plurality of electronic devices according to an embodiment.
Figure 15:
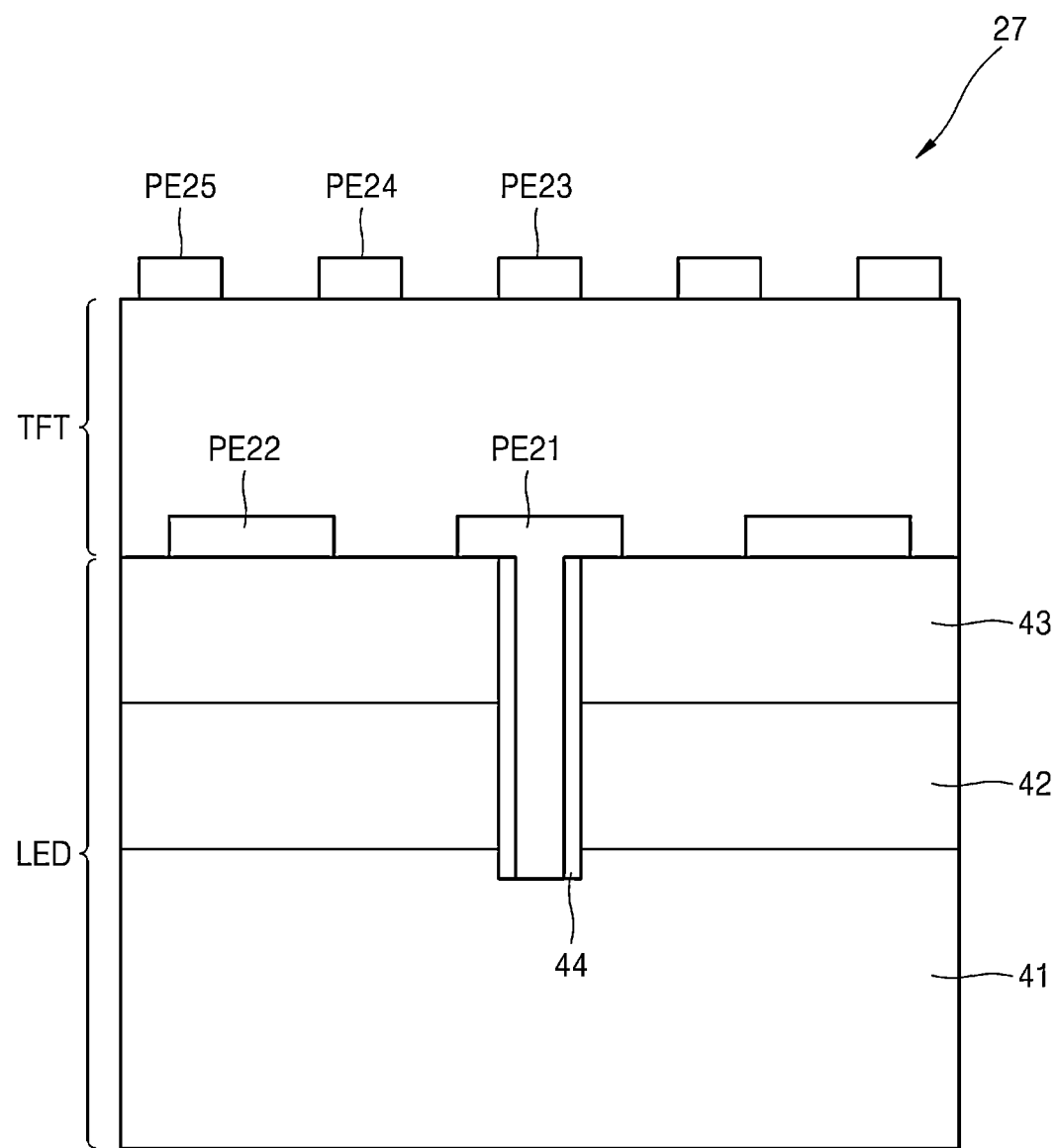
FIG. 15 illustrates an example configuration of a first electronic device among a plurality of electronic devices according to another embodiment.

FIG. 14 illustrates an example configuration of a first electronic device 26 among a plurality of electronic devices according to an embodiment. FIG. 15 illustrates an example configuration of a first electronic device 27 among a plurality of electronic devices according to another embodiment.

Referring to FIG. 14, any first electronic device 26 among the plurality of electronic devices may include a first conductivity type semiconductor layer 41, an active layer 42 provided on the first conductivity type semiconductor layer 41, a second conductivity type semiconductor layer 43 provided on the active layer 42, and a plurality of pad electrodes PE21 and PE22 provided on the second conductivity type semiconductor layer 43. The first electronic device 26 may be, for example, a light emitting device.

The first conductivity type semiconductor layer 41 may include an n-type semiconductor of a group III-V, for example, an n-type nitride semiconductor. The first conductivity type semiconductor layer 41 may include, for example, $Al_{x1}In_{y1}Ga_{1-x1-y1}N$ ($0 \leq x1 \leq 1$, $0 \leq y1 \leq 1$, $0 \leq (x1+y1) \leq 1$). The first conductivity type semiconductor layer 41 may include InAlGaN, GaN, AlGaN, InGaN, AlN, InN, or a combination thereof, and for example, the first conductive semiconductor layer 41 may include n-GaN. The first conductivity type semiconductor layer 41 may have a single-layer or multi-layer structure. The first conductivity type semiconductor layer 41 may include a first conductivity type dopant. The first conductivity type semiconductor layer 41 may include an n-type dopant, for example, Si, Ge, or Sn.

Light may be generated when electrons and holes are combined in the active layer 42. The active layer 42 may have a multi-quantum well (MQW) or a single-quantum well (SQW) structure. The active layer 42 may include a group III-V semiconductor. The active layer 42 may include $Al_{x2}In_{y2}Ga_{1-x2-y2}N$ ($0.1 \leq x2+y2) \leq 1$, $0.1 < y2 < 0.6$), for example, GaN.

The second conductivity type semiconductor layer 43 may include, for example, a p-type semiconductor. The second conductivity type semiconductor layer 43 may include a group III-V p-type semiconductor, for example, the second conductivity type semiconductor layer 43 may include $Al_{x1}In_{y1}Ga_{1-x1-y1}N$ ($0 \leq x1 \leq 1$, $0 \leq y1 \leq 1$, and $0 \leq (x1+y1) \leq 1$). The second conductivity type semiconductor layer 43 may include InAlGaN, GaN, AlGaN, InGaN, AlN, InN, or a combination thereof, for example, p-GaN. The second conductivity type semiconductor layer 43 may have a single-layer or multi-layer structure. The second conductivity type semiconductor layer 43 may include a second conductivity type dopant. The second conductivity type semiconductor layer 43 may include a p-type dopant, for example, Mg or B.

A hole penetrating the second conductivity type semiconductor layer 43 and the active layer 42 and extending to a partial region of the upper part of the first conductivity type semiconductor layer 41 may be formed in the first electronic device 26. The first electronic device 26 may include a first pad electrode PE21 filling the hole and covering a part of the upper surface of the second conductivity type semiconductor layer 43. In this case, an insulating layer 44 may be provided between the first pad electrode PE21 and each of the inner walls of the second conductivity type semiconductor layer 43, the active layer 42, and the first conductivity type semiconductor layer 41.

In addition, the first electronic device 26 may include a second pad electrode PE22 provided to surround the first pad electrode PE21 on an upper surface of the second conductivity type semiconductor layer 43. The arrangement of the first pad electrode PE21 and the second pad electrode PE22 is substantially the same as the arrangement of the first pad electrode PE14 and the second pad electrode PE15 of FIG. 10.

Referring to FIG. 15, the first electronic device 27 of the plurality of electronic devices may include a structure in which a light emitting device (LED) and a thin film transistor (TFT) layer are stacked. The configuration of the first electronic device 27 of FIG. 15 may be substantially the same as that of the first electronic device 26 of FIG. 14, except that the first electronic device 27 further includes a TFT layer. In the description of FIG. 15, the duplicated description of FIG. 14 is omitted.

The TFT layer may be formed to cover the first pad electrode PE14 and the second pad electrode PE15. The TFT layer may include a plurality of driving transistors including a gate electrode, a gate insulating layer, a channel layer, a source electrode, and a drain electrode. A plurality of pad electrodes PE23, PE24, and PE25 may be provided on the TFT layer. For example, a third pad electrode PE23, a fourth pad electrode PE24, and a fifth pad electrode PE25 may be included on the TFT layer. The fourth pad electrode PE24 may be provided to surround the third pad electrode PE23, and the fifth pad electrode PE25 may be provided to surround the fourth pad electrode PE24.

The third pad electrode PE23, the fourth pad electrode PE24, and the fifth pad electrode PE25 may be electrically connected to a plurality of driving transistors included in the TFT layer. In addition, a plurality of driving transistors included in the TFT layer may be electrically connected to the first pad electrode PE14 and the second pad electrode PE15. Accordingly, the third pad electrode PE23, the fourth pad electrode PE24, and the fifth pad electrode PE25 may be electrically connected to the first pad electrode PE14 and the second pad electrode PE15 through the plurality of driving transistors included in the TFT layer. The third pad electrode PE23, the fourth pad electrode PE24, and the fifth pad electrode PE25 are arranged in substantially the same manner as the first pad electrode PE14, the second pad electrode PE15, and the third pad electrode PE16 of FIG. 12.

Figure 16:
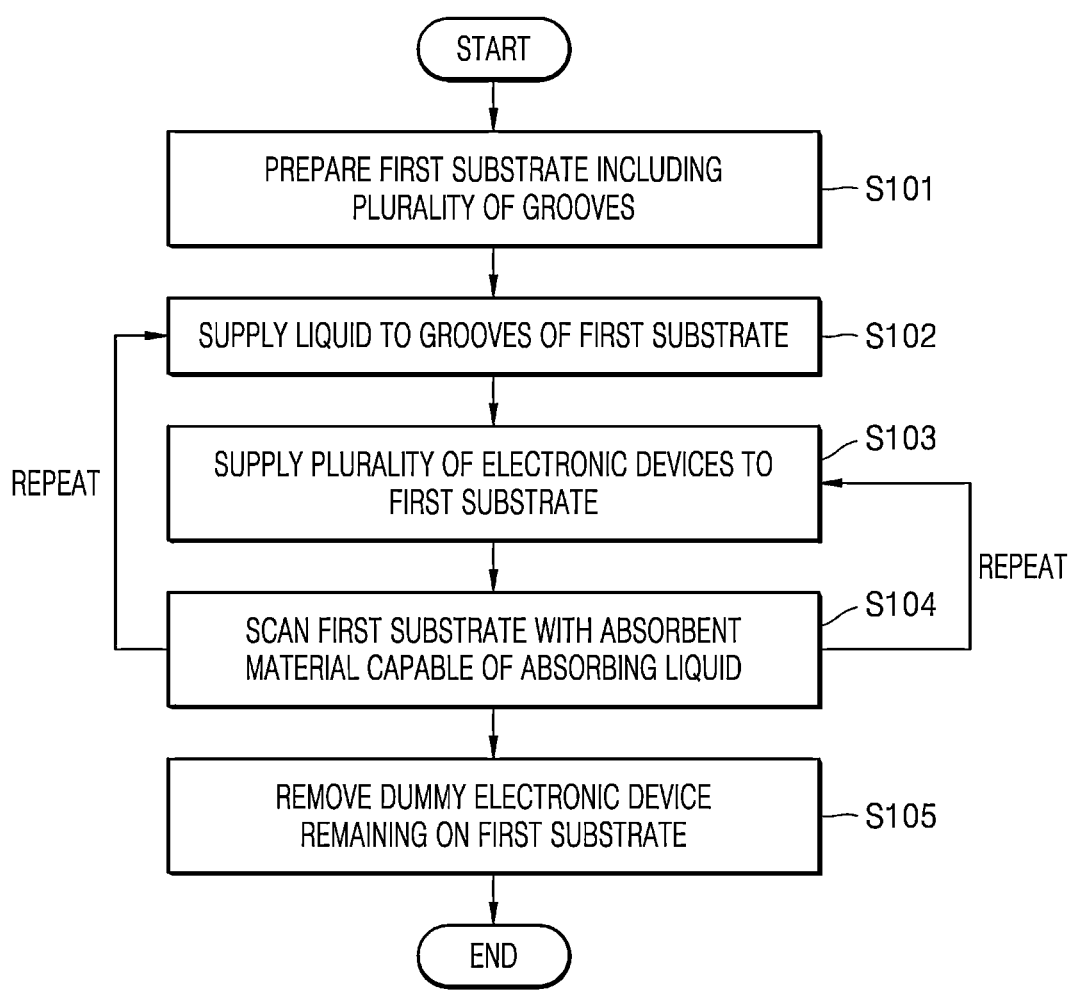
FIG. 16 is a flowchart schematically illustrating an electronic device array manufacturing method according to an embodiment.
Figure 17:
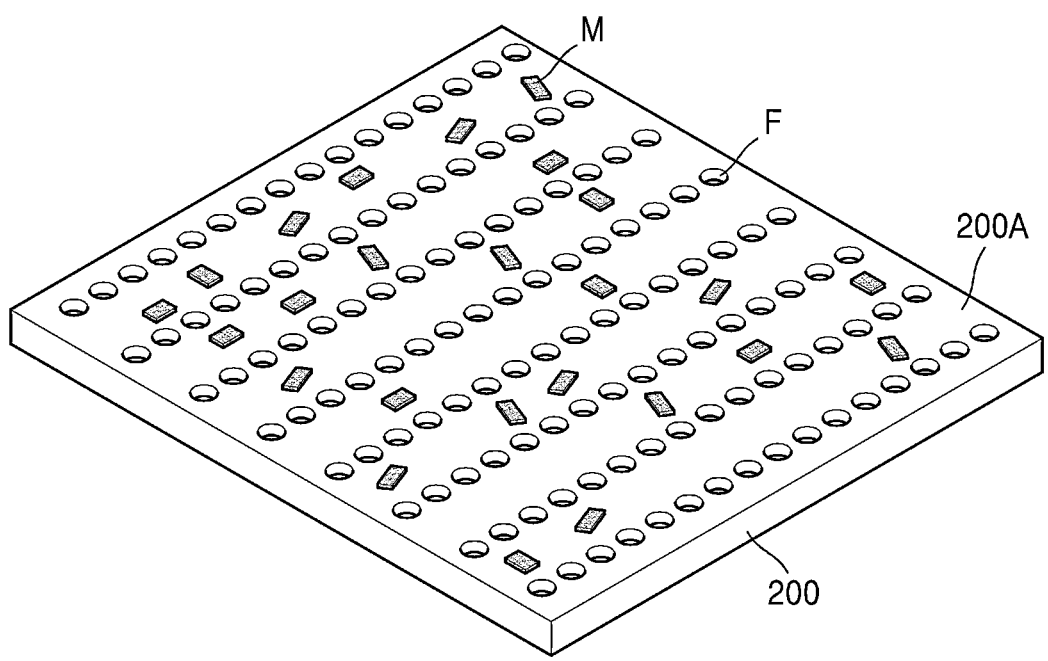
FIG. 17 schematically illustrates a configuration of an electronic device array manufacturing apparatus according to an embodiment.
Figure 18:
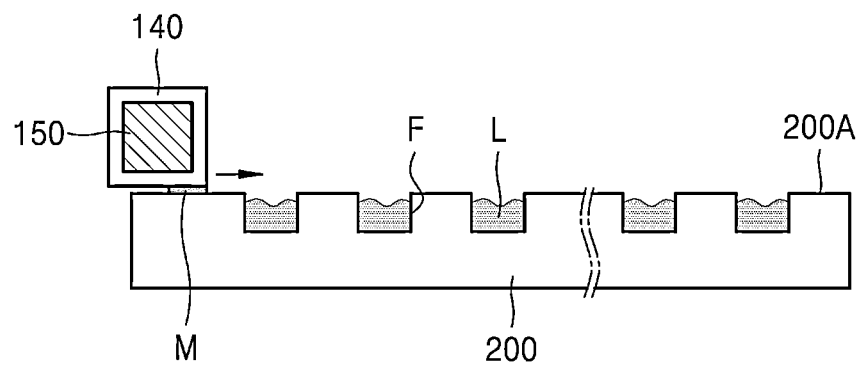
FIG. 18 illustrates a scanning process of an electronic device array manufacturing method according to an embodiment.
Figure 19:
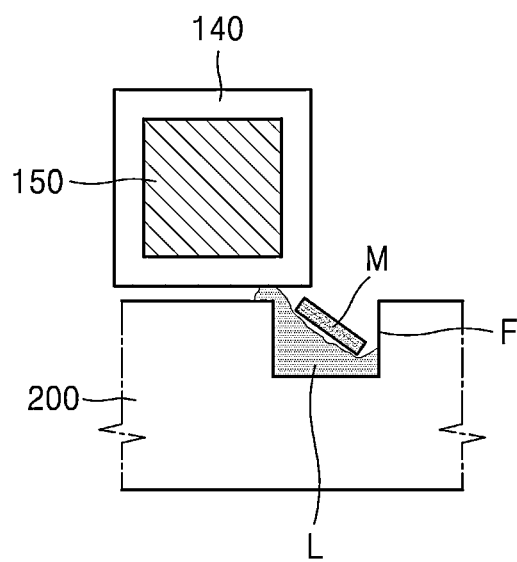
FIG. 19 illustrates a process in which electronic devices are aligned according to an electronic device array manufacturing method according to an embodiment.
Figure 20:
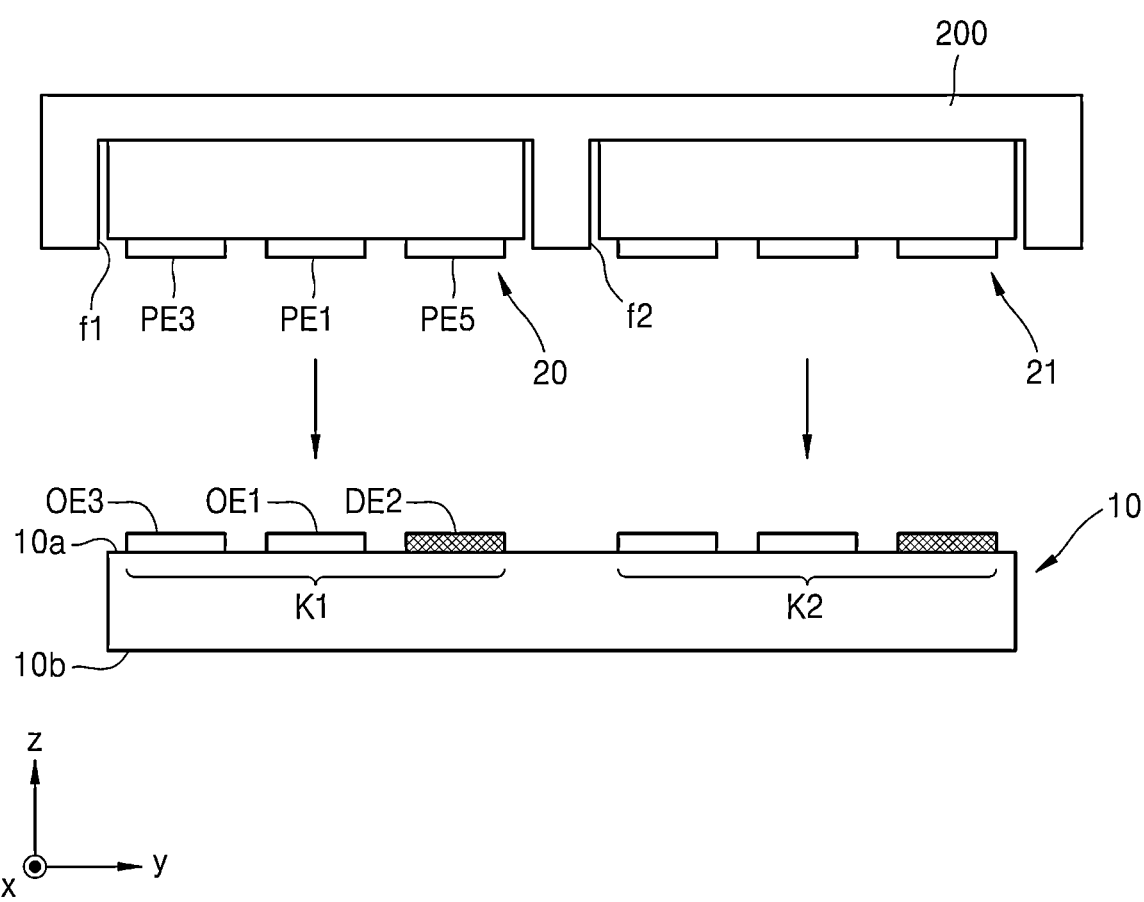
FIG. 20 is a view for illustrating transfer of a plurality of electronic devices included in an electronic device array onto a driving circuit board, according to an embodiment.

FIG. 16 is a flowchart schematically illustrating a method of manufacturing an electronic device array according to an embodiment. FIG. 17 schematically illustrates a configuration of an electronic device array manufacturing apparatus according to an embodiment. FIG. 18 illustrates a scanning process of an electronic device array manufacturing method according to an embodiment. FIG. 19 illustrates a process in which electronic devices M are aligned according to a method of manufacturing an electronic device array according to an embodiment. FIG. 20 is a view for illustrating transferring a plurality of electronic devices 20 and 21 included in an electronic device array onto a driving circuit board 10 according to an embodiment.

A method of manufacturing an electronic device array according to an embodiment illustrated in FIG. 16 includes a wet alignment method.

Referring to FIG. 16, a method of manufacturing an electronic device array according to an embodiment may include: preparing a first substrate 200 including a plurality of grooves F formed on one surface thereof (see step S101), supplying a liquid L to the plurality of grooves F of the first substrate 200 (see step S102), supplying a plurality of electronic elements M to the first substrate 200 (see step S103); and scanning the first substrate 200 with an absorbent material 140 capable of absorbing liquid L to align the plurality of electronic devices M into the plurality of grooves F (see step S104). Furthermore, the method of manufacturing an electronic device array according to an embodiment may further include removing the dummy electronic device remaining on the first substrate 200 (see step S105) after all the electronic devices M are transferred to the first substrate 200. Hereinafter, the method of manufacturing an electronic device array according to an embodiment will be described with reference to FIGS. 16 to 19.

The plurality of electronic devices M may include any one of the first electronic devices 20, 22, 23, 24, 25, 26, and 27 according to various embodiments described with reference to FIGS. 1 to 15.

A first substrate 200 including a plurality of grooves F formed on one surface thereof is prepared (see step S101). The first substrate 200 may be provided as a single layer or may include a plurality of layers. The plurality of grooves F may be provided to arrange at least one electronic device M. A size of each of the plurality of electronic devices M may be smaller than a size of each of the plurality of grooves F included in the first substrate 200. For example, the size of each of the plurality of electronic devices M may be smaller than the diameter of each of the plurality of grooves F.

Liquid is supplied to the plurality of grooves F (see step S102). As for the liquid, any type of liquid may be used as long as it does not corrode or damage the plurality of electronic devices M. The liquid may include, for example, at least one of a group comprising water, ethanol, alcohol, polyol, ketone, halocarbon, acetone, flux, or organic solvent. The organic solvent may include, for example, isopropyl alcohol (IPA). The liquid is not limited thereto and various modifications are possible.

A method of supplying liquids to a plurality of grooves F may variously include, for example, a spray method, a dispensing method, an inkjet dot method, or a method of flowing liquids to the first substrate 200.

A plurality of electronic elements M are supplied to the first substrate 200 (see step S103). The plurality of electronic devices M may be directly sprayed on the first substrate 200 without liquid or supplied using a material other than liquid. Alternatively, the plurality of electronic devices M may be supplied to the first substrate 200 in various ways in a state of being included in a suspension. In this case, a method of supplying a plurality of electronic devices M may include various methods, such as a spray method, a dispensing method, an inkjet dot method, and a method of flowing a suspension to the first substrate 200. The method of supplying the plurality of electronic devices M to the first substrate 200 is not limited thereto and may be variously modified. The liquid may be supplied to fit the plurality of grooves F, or the liquid may be supplied to overflow from the plurality of grooves F. The supply amount of the liquid may be variously controlled.

The first substrate 200 is scanned with the absorbent material 140 capable of absorbing liquid (see step S104). The absorbent material 140 is sufficient as long as it is a material capable of absorbing liquid, and its shape or structure is not limited. The absorbent material 140 may include, for example, fabric, tissue, polyester fiber, paper, or wipers. The absorbent material 140 may be used alone without other auxiliary devices. However, the embodiments are not limited thereto, and the absorbent material 140 may be coupled to the support 150 to facilitate scanning the first substrate 200 with the absorbent material 140. The support 150 may have various shapes and structures suitable for scanning the first substrate 200. The support 150 may include, for example, a rod, a blade, a plate, a wiper, or the like. The absorbent material 140 may be provided on any one surface of the support 150, or the absorbent material 140 may be wound around the support 150.

The absorbent material 140 may scan the first substrate 200 while pressing the first substrate 200 at an appropriate pressure. The scanning may include allowing the absorbent material 140 to contact the first substrate 200 and pass through the plurality of grooves F. During scanning, the liquid may be absorbed into the absorbent material 140. Scanning may be performed in various irregular ways including, for example, at least one of a sliding method, a rotating method, a translating motion method, a reciprocating motion method, a rolling method, a spinning method, or a rubbing method of the absorbent material 140, and may include a regular method or an irregular method in any case. Alternatively, the scanning may include at least one of rotational motion, translational motion, rolling motion, or spinning of the first substrate 200. Alternatively, the scanning may be performed by cooperation between the absorbent material 140 and the first substrate 200.

Scanning the first substrate 200 with the absorbent material 140 may include absorbing liquid in the plurality of grooves F while passing through the plurality of grooves F. When the absorbent material 140 scans the first substrate 200, at least one of the plurality of electronic devices M may be attached to the absorbent material 140. Then, the absorbent material 140 may contact the first substrate 200 and pass through the plurality of grooves F.

In the process of scanning the first substrate 200 with the absorbent material 140 that can absorb the liquid, the plurality of electronic devices M may be aligned in each of the plurality of grooves F. In this case, a plurality of electronic devices M may be aligned in the plurality of grooves F such that a plurality of pad electrodes included in the plurality of electronic devices M face an upper opening of each of the plurality of grooves F.

In FIG. 16, the operation S102 of supplying liquids to the plurality of grooves F of the first substrate 200 and the operation S103 of supplying the plurality of electronic devices M to the first substrate 200 may be sequentially performed in separate operations, in a sequential order or in opposite order. In addition, the operation S102 of supplying liquids to the plurality of grooves F of the first substrate 200 and the operation S103 of supplying the plurality of electronic devices M to the first substrate 200 may be simultaneously performed as one operation.

Next, after all the electronic devices M are transferred to the first substrate 200, the dummy electronic devices remaining on the first substrate 200 are removed (see step S105).

Referring to FIG. 18, the absorbent material 140 may be provided on the surface of the support 150, and the absorbent material 140 may be scanned in a state of contacting the surface of the first substrate 200. When the absorbent material 140 is scanned, at least some of the plurality of electronic devices M may be adsorbed or attached to the surface of the absorbent material 140. At least some of the plurality of adsorbed or attached electronic devices M may be pushed forward and moved by the absorbent material 140. The plurality of electronic devices M may be positioned between the absorbent material 140 and the first substrate 200.

FIG. 19 is an enlarged view of any one of the plurality of grooves F. At least one of the plurality of electronic devices M moved by the absorbent material 140 may enter any one of the plurality of grooves F. Here, the absorbent material 140 absorbs the liquid L in any one of the plurality of grooves F, and at least one of the plurality of electronic devices M may enter any one of the plurality of grooves F.

Referring back to FIGS. 16 and 17, at least one of operations S102, S103, and S104 may be repeated as necessary until the plurality of electronic devices M are all transferred to the plurality of grooves F of the first substrate 200. For example, after the first substrate 200 is scanned with the absorbent material 140, when liquid is not present in the plurality of grooves F or is not sufficient, the operation S102 of supplying the liquid to the plurality of grooves F may be further performed. Here, if the plurality of electronic devices M are not insufficient in the first substrate 200, it is possible to move from operation S102 to operation S104 without going through operation S103. Alternatively, when too much liquid is supplied to the first substrate 200, some liquid may be removed using a blade as necessary.

Alternatively, after scanning the first substrate 200 with the absorbent material 140, when a plurality of electronic devices M are insufficient in the first substrate 200, the operation S103 of supplying the plurality of electronic devices M to the first substrate 200 may be further performed.

Through the above process, the plurality of electronic devices M may be aligned on the first substrate 200.

Referring to FIG. 17, the first substrate 200 may be, for example, a mold substrate. The plurality of grooves F may be provided in the first substrate 200. An oxide layer may be further provided in the middle of the first substrate 200. An oxide layer may include, for example, $SiO_2$, $Al_2O_3$, or $NiO_2$. The oxide layer included in the first substrate 200 may be exposed to the outside by the plurality of grooves F. The oxide layer may have hydrophilicity. The oxide layer may help fill the plurality of grooves F with liquid. An area of an upper surface of the first substrate 200 may be greater than 4 inches. For example, the area of the upper surface of the first substrate 200 may be greater than 8 inches and smaller than 9 inches. However, the embodiments are not limited thereto, and the area of the upper surface of the first substrate 200 may be greater than 9 inches.

The electronic device array manufactured in the same manner as described with reference to FIGS. 16 to 19 may be arranged on a second substrate different from that of the first substrate 200. Referring to FIG. 20, the first electronic device 20 may be aligned with the first groove f1 of the first substrate 200, and the second electronic device 21 may be aligned with the second groove f2. The configurations of the first electronic device 20 and the second electronic device 21 are the same as those described with reference to FIGS. 1 to 6, and thus a description thereof will be omitted.

Referring to FIG. 20, an electronic device array including the first electronic device 20, the second electronic device 21, and the first substrate 200 may be arranged on a second substrate different from the first substrate 200. Here, the second substrate may be the driving circuit board 10 of FIG. 20. The configuration of the driving circuit board 10 is the same as described with reference to FIGS. 1 to 6, and thus a description thereof will be omitted.

The first substrate 200 and the driving circuit board 10 may be arranged to face each other such that a plurality of grooves f1 and f2 of the first substrate 200 and the plurality of driving electrode regions K1 and K2 of the driving circuit board 10 face each other.

The plurality of electronic devices 20 and 21 aligned in the plurality of grooves f1 and f2 and the plurality of driving electrodes provided in the plurality of driving electrode regions K1 and k2 of the driving circuit board 10 may be bonded.

After the plurality of electronic devices 20 and 21 and the plurality of driving electrodes provided in the plurality of driving electrode regions K1 and k2 of the driving circuit board 10 are bonded, the first substrate 200 may be removed. Accordingly, an electronic apparatus having a structure in which the plurality of electronic devices 20 and 21 are bonded to the plurality of driving electrodes provided in the plurality of driving electrode regions K1 and k2 of the driving circuit board 10 may be manufactured. This electronic apparatus may be, for example, a display device.

Figure 21:
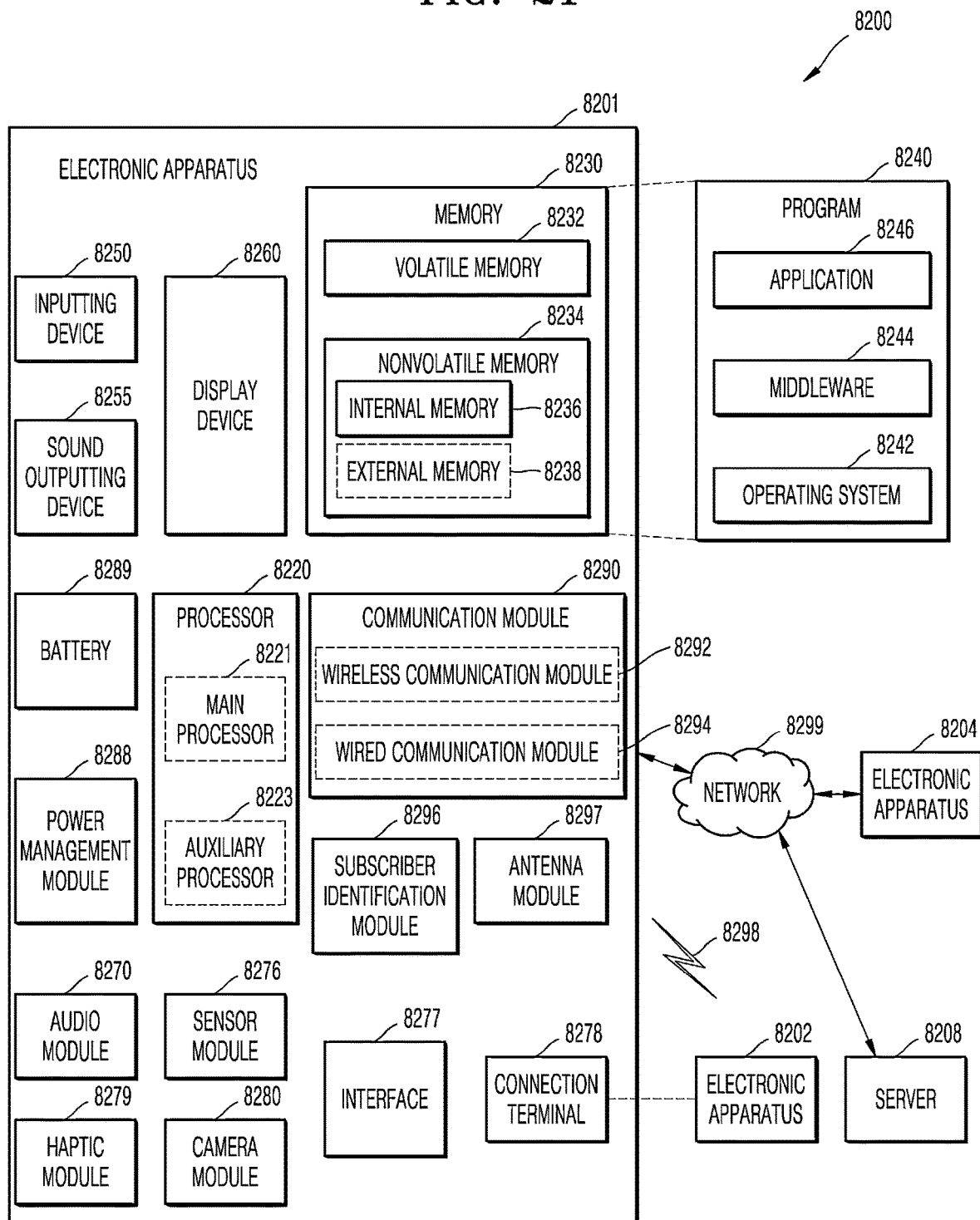
FIG. 21 is a block diagram of an electronic apparatus including a display device according to an embodiment.

FIG. 21 is a block diagram of an electronic apparatus 8201 including a display device 8260 according to an embodiment.

Referring to FIG. 21, an electronic apparatus 8201 may be provided in a network environment 8200. In the network environment 8200, the electronic apparatus 8201 may communicate with another electronic apparatus 8202 through a first network 8298 (such as a short-range wireless communication network) or another electronic apparatus 8204 and/or server 8208 through a second network 8299 (such as a long-range wireless communication network). The electronic apparatus 8201 may communicate with the electronic apparatus 8204 through the server 8208. The electronic apparatus 8201 may include a processor 8220, a memory 8230, an input device 8250, an audio output device 8255, a display device 8260, an audio module 8270, a sensor module 8276, an interface 8277, a haptic module 8279, a camera module 8280, a power management module 8288, a battery 8289, a communication module 8290, a subscriber identification module 8296 and/or an antenna module 8297. Some of these components may be omitted from or other components may be added to the electronic apparatus 8201. Some of these components may be implemented as one integrated circuit. For example, the sensor module 8276 (fingerprint sensor, iris sensor, illumination sensor, etc.) may be implemented by being embedded in the display device 8260 (display, etc.).

The processor 8220 may execute software (program 8240 or the like) to control one or a plurality of other components (hardware, software components, etc.) of the electronic apparatus 8201 connected to the processor 8220, and may perform various data processing or operations. As part of data processing or operation, the processor 8220 may load commands and/or data received from other components (sensor modules 8276, communication modules 8290, etc.) in volatile memory 8232, process commands and/or data stored in volatile memory 8232, and store the result data in nonvolatile memory 8234. The processor 8220 may include a main processor 8221 (a central processing unit, an application processor, etc.) and an auxiliary processor 8223 (a graphics processing unit, an image signal processor, a sensor hub processor, a communication processor, etc.) that may be operated independently of or together with the main processor 8221. The auxiliary processor 8223 may use less power than the main processor 8221 and perform a specialized function.

The auxiliary processor 8223 may control the functionality and/or status associated with some of the components of the electronic apparatus 8201 (the display device 8260, the sensor module 8276, the communication module 8290, etc.), in place of the main processor 8221 while the main processor 8221 is in an inactive state (sleep state), or in conjunction with the main processor 8221 while the main processor 8221 is in an active state (application execution state). The auxiliary processor 8223 (image signal processor, communication processor, etc.) may be implemented as part of other functionally related components (camera module 8280, communication module 8290, etc.).

The memory 8230 may store various data required by components (processor 8220 and sensor module 8276) of the electronic apparatus 8201. The data may include, for example, input data and/or output data for software (program 8240 or the like) and related commands. The memory 8230 may include a volatile memory 8232 and/or a non-volatile memory 8234.

The program 8240 may be stored in the memory 8230 as software, and may include an operating system 8242, middleware 8244, and/or an application 8246.

The input device 8250 may receive commands and/or data to be used in components (processor 8220, etc.) of the electronic apparatus 8201 from the outside (user, etc.) of the electronic apparatus 8201. The input device 8250 may include a remote controller, a microphone, a mouse, a keyboard, and/or a digital pen (such as a stylus pen).

The sound output device 8255 may output the sound signal to the outside of the electronic apparatus 8201. The sound output device 8255 may include a speaker and/or a receiver. Speakers may be used for general purposes such as multimedia playback or recording playback, and receivers may be used to receive incoming calls. The receiver may be coupled as part of a speaker or may be implemented as an independent separate device.

The display device 8260 may visually provide information to the outside of the electronic apparatus 8201. The display device 8260 may include a display, a hologram device, or a projector and a control circuit for controlling the corresponding device. For example, the display device 8260 may include various types of display devices including a structure in which a plurality of first electronic devices 20, 22, 23, 24, 25, 26, and 27 are transferred to the driving circuit boards 10, 11, 12, and 13 described with reference to FIGS. 1 to 15. The display device 8260 may include a touch circuit configured to sense a touch, and/or a sensor circuit (a pressure sensor, etc.) configured to measure an intensity of a force generated by the touch.

The audio module 8270 may convert sound into an electrical signal or conversely convert the electrical signal into sound. The audio module 8270 may acquire sound through the input device 8250 or output sound through the sound output device 8255 and/or a speaker and/or a headphone of another electronic apparatus (e.g., electronic apparatus 8102, etc.) directly or wirelessly connected to the electronic apparatus 8201.

The sensor module 8276 may detect an operating state (power, temperature, etc.) or an external environmental state (user state, etc.) of the electronic apparatus 8201 and generate an electrical signal and/or a data value corresponding to the sensed state. The sensor module 8276 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, and/or an illumination sensor.

The interface 8277 may support one or more designated protocols that may be used for electronic apparatus 8201 to be directly or wirelessly connected to another electronic apparatus (e.g., electronic apparatus 8102, etc.). The interface 8277 may include a high definition multimedia interface (H DMI), a universal serial bus (USB) interface, an SD card interface, and/or an audio interface.

The connection terminal 8278 may include a connector through which the electronic apparatus 8201 may be physically connected to another electronic apparatus (e.g., electronic apparatus 8102, etc.). The connection terminal 8278 may include an HDMI connector, a USB connector, an SD card connector, and/or an audio connector (such as a headphone connector, etc.).

The haptic module 8279 may convert an electrical signal to a mechanical stimulus (vibration, motion, etc.) or an electrical stimulus that a user can recognize through a tactile or motion sensation. The haptic module 8279 may include a motor, a piezoelectric element, and/or an electrical stimulus.

The camera module 8280 may capture a still image and a moving image. The camera module 8280 may include a lens assembly including one or more lenses, image sensors, image signal processors, and/or flashes. The lens assembly included in the camera module 8280 may collect light emitted from an object to be photographed.

The power management module 8288 may manage power supplied to the electronic apparatus 8201. The power management module 8288 may be implemented as part of a power management integrated circuit (PMIC).

The battery 8289 may supply power to components of the electronic apparatus 8201. The battery 8289 may include a non-rechargeable primary battery, a rechargeable secondary battery, and/or a fuel cell.

The communication module 8290 may establish a direct (wired) communication channel and/or wireless communication channel between the electronic apparatus 8201 and another electronic apparatus (the electronic apparatus 8102, the electronic apparatus 8104, the server 8108, etc.), and support communication execution through the established communication channel. The communication module 8290 may include one or more communication processors that operate independently of the processor 8220 (application processor, etc.) and support direct communication and/or wireless communication. The communication module 8290 may include a wireless communication module 8292 (a cellular communication module, a short-range wireless communication module, a GNSS (Global Navigation Satellite System, etc.) communication module, and/or a wired communication module 8294 (a local area network (LAN) communication module, a power line communication module, etc.). A corresponding communication module of these communication modules may communicate with other electronic apparatuses through a first network 8298 (a short-range communication network such as Bluetooth, WiFi Direct, or infrared data association (IrDA)), or a second network 8299 (a long-range communication network such as a cellular network, Internet, or computer networks (LAN, WAN, etc.)). These various types of communication modules may be integrated into a single component (such as a single chip, etc.), or may be implemented as a plurality of separate components (multiple chips). The wireless communication module 8292 may identify and authenticate the electronic apparatus 8201 in a communication network such as a first network 8298 and/or a second network 8299 using subscriber information (such as an international mobile subscriber identifier (IMSI) stored in the subscriber identification module 8296.

The antenna module 8297 may transmit a signal and/or power to the outside (such as another electronic apparatus, etc.) or receive the signal and/or power from the outside. The antenna may include a radiator formed of a conductive pattern formed on the substrate (PCB, etc.). The antenna module 8297 may include one or a plurality of antennas. When a plurality of antennas are included, an antenna suitable for a communication scheme used in a communication network such as a first network 8298 and/or a second network 8299 may be selected from among the plurality of antennas by the communication module 8290. A signal and/or power may be transmitted or received between the communication module 8290 and another electronic apparatus through the selected antenna. Other components (RFIC, etc.) in addition to the antenna may be included as a part of the antenna module 8297.

Some of the components may be connected to each other via communication methods between peripherals (such as buses, General Purpose Input and Output (GPIO), Serial Peripheral Interface (SPI), and Mobile Industry Processor Interface (MIPI), etc.) to interchange signals (commands, data, etc.).

The command or data may be transmitted or received between the electronic apparatus 8201 and the external electronic apparatus 8204 through the server 8108 connected to the second network 8299. Other electronic apparatuses 8202 and 8204 may be the same or different types of apparatuses as the electronic apparatus 8201. All or some of the operations executed in the electronic apparatus 8201 may be executed in one or more of the other electronic apparatuses 8202, 8204, and 8208. For example, when the electronic apparatus 8201 needs to perform a function or service, it may request one or more other electronic apparatuses to perform part or all of the function or service instead of executing the function or service on its own. One or more other electronic apparatuses receiving the request may execute an additional function or service related to the request and transmit a result of the execution to the electronic apparatus 8201. To this end, cloud computing, distributed computing, and/or client-server computing technology may be used.

Figure 22:
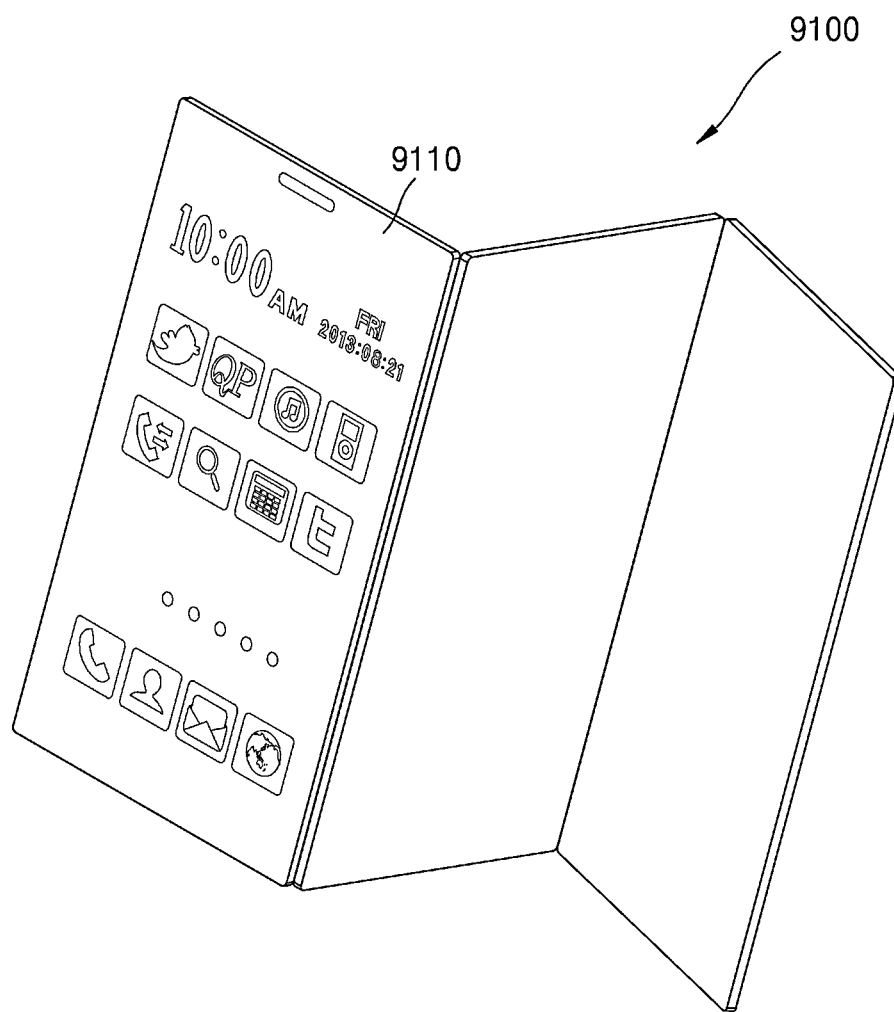
FIG. 22 illustrates an example in which an electronic apparatus according to an embodiment is applied to a mobile device.

FIG. 22 illustrates an example in which an electronic apparatus according to an embodiment is applied to a mobile device 9100.

Referring to FIG. 22, the mobile device 9100 may include a display device 9110 according to an embodiment. For example, the display device 9110 may include various types of display devices including a structure in which a plurality of first electronic devices 20, 22, 23, 24, 25, 26, and 27 are transferred to the driving circuit boards 10, 11, 12, and 13 described with reference to FIGS. 1 to 15. The display device 9110 may have a foldable structure, and may be applied to, for example, a multi-folder display. Here, although the mobile device 9100 is illustrated as a folder type display, it may be applied to a general flat type display.

Figure 23:
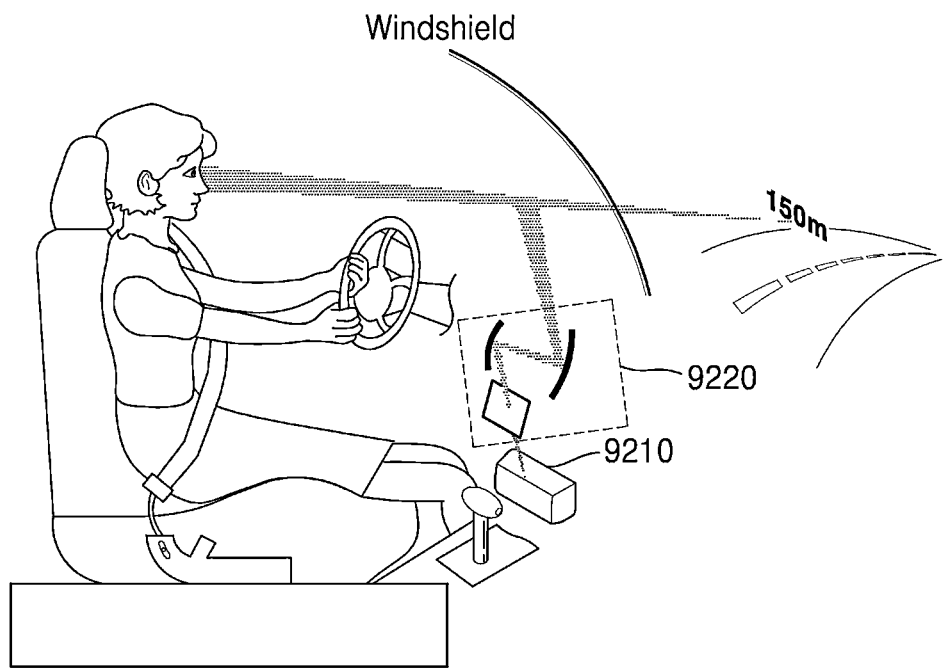
FIG. 23 illustrates an example in which a display device according to an embodiment is applied to a vehicle.

FIG. 23 illustrates an example in which a display device according to an embodiment is applied to a vehicle.

Referring to FIG. 23, a display device may be applied to a head-up display device for a vehicle. The head-up display device may include a display device 9210 provided in one area of a vehicle and at least one optical path changing member 9220 that converts a path of light so that a driver may view an image generated by the display device 9210. For example, the display device 9210 may include various types of display devices including a structure in which a plurality of first electronic devices 20, 22, 23, 24, 25, 26, and 27 are transferred to the driving circuit boards 10, 11, 12, and 13 described with reference to FIGS. 1 to 15.

Figure 24:
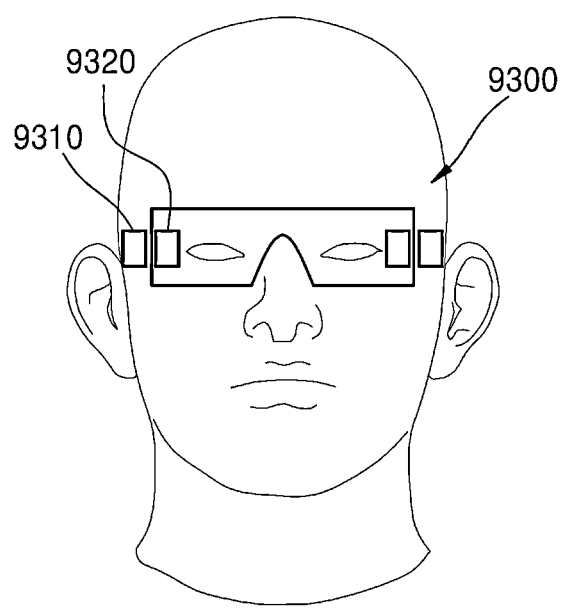
FIG. 24 illustrates an example in which a display device according to an embodiment is applied to augmented reality glasses or virtual reality glasses.

FIG. 24 illustrates an example in which a display device according to an embodiment is applied to augmented reality glasses or virtual reality glasses.

Referring to FIG. 24, the augmented reality glasses 9300 may include a projection system 9310 forming an image and at least one element 9320 guiding an image from the projection system 9310 to enter a user's eye. For example, the projection system 9310 may include various types of display devices including a structure in which a plurality of first electronic devices 20, 22, 23, 24, 25, 26, and 27 are transferred to the driving circuit boards 10, 11, 12, and 13 described with reference to FIGS. 1 to 15.

Figure 25:
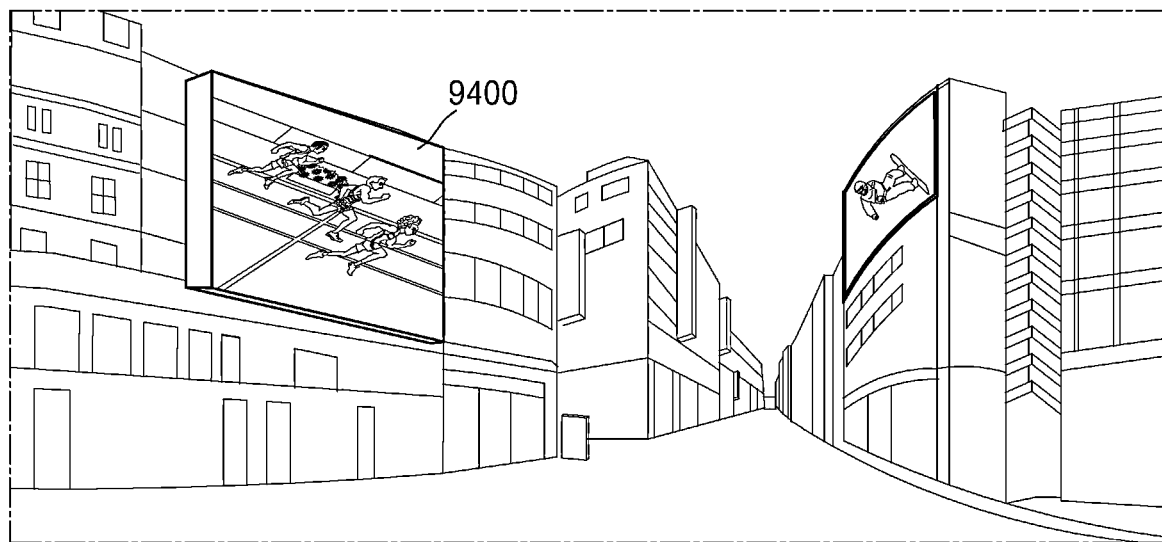
FIG. 25 illustrates an example in which a display device according to an embodiment is applied to a large signage.

FIG. 25 illustrates an example in which a display device according to an embodiment is applied to a large signage.

Referring to FIG. 25, the signage 9400 may be used for outdoor advertising using a digital information display, and may control advertising content, etc. through a communication network. The signage 9400 may be implemented, for example, through the electronic apparatus 8201 described with reference to FIG. 21.

Figure 26:
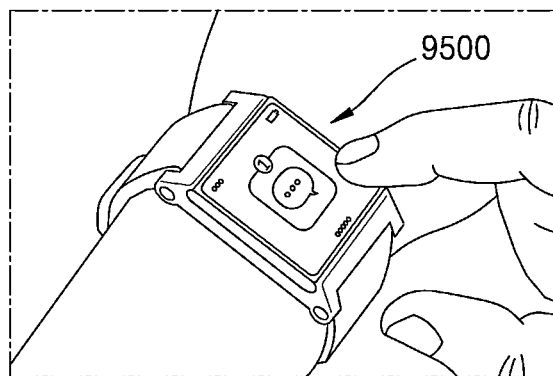
FIG. 26 illustrates an example in which a display device according to an embodiment is applied to a wearable display.

FIG. 26 illustrates an example in which a display device according to an embodiment is applied to a wearable display.

Referring to FIG. 26, the wearable display 9500 may include various types of display devices including a structure in which a plurality of first electronic devices 20, 22, 23, 24, 25, 26, and 27 are transferred to the driving circuit boards 10, 11, 12, and 13 described with reference to FIGS. 1 to 15, and may be implemented through the electronic apparatus 8201 described with reference to FIG. 21.

The display device in accordance with an example embodiment may be applied to various products such as a rollable TV, a stretchable display, and the like.

According to various embodiments of the present disclosure, provided are a driving circuit board including driving electrodes having a structure which may be efficiently connected to pad electrodes of a plurality of electronic devices when the plurality of electronic devices are arranged on a driving circuit board, an electronic apparatus including the driving circuit board, and a method of manufacturing the electronic apparatus.

According to various embodiments of the present disclosure, a driving circuit board including a plurality of driving electrodes arranged to have rotation symmetry at all angles, an electronic apparatus including the driving circuit board, and a method of manufacturing the electronic apparatus may be provided.

According to various embodiments of the present disclosure, a part of the plurality of driving electrodes is formed as a dummy electrode not connected to a driving circuit, thereby efficiently connecting the pad electrodes of the plurality of electronic devices to the plurality of driving electrodes.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A driving circuit board comprising:
   a plurality of driving electrode regions on a surface of the driving circuit board;
   a plurality of driving electrodes symmetrically arranged on the plurality of driving electrode regions; and
   a driving circuit electrically connected to at least one of the plurality of driving electrodes, wherein the plurality of driving electrodes comprise at least one dummy electrode that is not connected to the driving circuit, wherein each of the plurality of driving electrode regions comprises a first sub-driving electrode region and a second sub-driving electrode region that is different from the first sub-driving electrode region, and wherein the plurality of driving electrodes further comprise a first driving electrode provided in the first sub-driving electrode region and a second driving electrode provided in the second sub-driving electrode region and electrically disconnected to the first driving electrode.

2. The driving circuit board of claim 1, wherein the first sub-driving electrode region is a central region of each of the plurality of driving electrode regions, and the second sub-driving electrode region surrounds the first sub-driving electrode region.

3. The driving circuit board of claim 1, wherein the second driving electrode comprises at least one first sub-driving electrode and at least one first dummy electrode that are spaced apart from each other.

4. The driving circuit board of claim 3, wherein the at least one first sub-driving electrode is electrically connected to the driving circuit, and the at least one first dummy electrode is electrically disconnected with respect to the at least one first sub-driving electrode.

5. The driving circuit board of claim 1, wherein each of the plurality of driving electrode regions further comprises a third sub-driving electrode region that is different from the first sub-driving electrode region and the second sub-driving electrode region, and wherein the plurality of driving electrodes further comprise a third driving electrode provided in the third sub-driving electrode region and electrically disconnected with respect to the first driving electrode and the second driving electrode.

6. The driving circuit board of claim 5, wherein the first sub-driving electrode region is a central region of each of the plurality of driving electrode regions, the second sub-driving electrode region surrounds the first sub-driving electrode region, and the third sub-driving electrode region surrounds the second sub-driving electrode region.

7. The driving circuit board of claim 5, wherein the second driving electrode comprises at least one first sub-driving electrode and at least one first dummy electrode that are spaced apart from each other, and wherein the third driving electrode comprises at least one second sub-driving electrode and at least one second dummy electrode that are spaced apart from each other.

8. The driving circuit board of claim 7, wherein the at least one first sub-driving electrode is electrically connected to the driving circuit, and the at least one first dummy electrode is electrically disconnected with respect to the at least one first sub-driving electrode, and wherein the at least one second sub-driving electrode comprises at least two second sub-driving electrodes that are electrically connected to each other, and the at least one second dummy electrode is electrically disconnected with respect to the at least two second sub-driving electrodes.

9. An electronic apparatus comprising:
a driving circuit board comprising:
 a plurality of driving electrode regions on a first surface of the driving circuit board;
 a plurality of driving electrodes symmetrically arranged in the plurality of driving electrode regions; and
 a driving circuit electrically connected to at least one of the plurality of driving electrodes; and
at least one electronic device provided on the driving circuit board and comprising a plurality of pad electrodes symmetrically arranged on a second surface of the at least one electronic device to respectively face the plurality of driving electrodes in the plurality of driving electrode regions on the first surface of the driving circuit board, wherein the plurality of driving electrodes comprise at least one dummy electrode that is not connected to the driving circuit, wherein each of the plurality of driving electrode regions comprises a first sub-driving electrode region and a second sub-driving electrode region that is different from the first sub-driving electrode region, and wherein the plurality of driving electrodes further comprises a first driving electrode provided on the first sub-driving electrode region and a second driving electrode provided on the second sub-driving electrode region and electrically disconnected to the first driving electrode.

10. The electronic apparatus of claim 9,
wherein the at least one electronic device further comprises a first pad region and a second pad region on the second surface of the at least one electronic device, and the second pad region is different from the first pad region, and wherein the plurality of pad electrodes comprise a first pad electrode provided in the first pad region and a second pad electrode provided in the second pad region and electrically disconnected to the first pad electrode.

11. The electronic apparatus of claim 10, wherein the first sub-driving electrode region and the second sub-driving electrode region are arranged to correspond to the first pad region and the second pad region, respectively.

12. The electronic apparatus of claim 10, wherein the first sub-driving electrode region is a central region of each of the plurality of driving electrode regions, and the second sub-driving electrode region surrounds the first sub-driving electrode region, and wherein the first pad region is a central region of the second surface of the at least one electronic device, and the second pad region surrounds the first pad region.

13. The electronic apparatus of claim 12, wherein the second pad electrode has a ring shape and surrounds the first pad electrode.

14. The electronic apparatus of claim 10, wherein the second driving electrode comprises at least one first sub-driving electrode and at least one first dummy electrode that are spaced apart from each other, and wherein the second pad electrode comprises at least two first sub-pad electrodes that are spaced apart from each other.

15. The electronic apparatus of claim 14, wherein the at least one first sub-driving electrode is electrically connected to the driving circuit, and the at least one first dummy electrode is electrically disconnected with respect to the at least one first sub-driving electrode.

16. The electronic apparatus of claim 14, wherein the at least two first sub-pad electrodes are electrically connected to the at least one first sub-driving electrode and the at least one first dummy electrode.

17. The electronic apparatus of claim 10, wherein each of the plurality of driving electrode regions further comprises a third sub-driving electrode region that is different from the first sub-driving electrode region and the second sub-driving electrode region,
- wherein the plurality of driving electrodes further comprise a third driving electrode provided in the third sub-driving electrode region and electrically disconnected with respect to the first driving electrode and the second driving electrode,
- wherein the at least one electronic device further comprises a third pad region on the second surface of the at least one electronic device, the third pad region being different from the first pad region and the second pad region, and
- wherein the plurality of pad electrodes further comprise a third pad electrode which is provided in the third pad region and is electrically disconnected with respect to the first pad electrode and the second pad electrode.

18. The electronic apparatus of claim 17, wherein the first sub-driving electrode region, the second sub-driving electrode region, and the third sub-driving electrode region are arranged to correspond to the first pad region, the second pad region, and the third pad region, respectively.

19. The electronic apparatus of claim 17, wherein the first sub-driving electrode region is a central region of each of the plurality of driving electrode regions, the second sub-driving electrode region surrounds the first sub-driving electrode region, and the third sub-driving electrode region surrounds the second sub-driving electrode region, and
- wherein the first pad region is a central region of the second surface, the second pad region surrounds the first pad region, and the third pad region surrounds the second pad region.

20. The electronic apparatus of claim 17, wherein the second driving electrode comprises at least one first sub-driving electrode and at least one first dummy electrode that are spaced apart from each other,
- wherein the second pad electrode comprises at least two first sub-pad electrodes that are spaced apart from each other in the second pad region,
- wherein the third driving electrode comprises at least one second sub-driving electrode and at least one second dummy electrode that are spaced apart from each other, and
- wherein the third pad electrode comprises at least two second sub-pad electrodes that are spaced apart from each other in the third pad region.

21. The electronic apparatus of claim 20, wherein the driving circuit comprises a first driving circuit and a second driving circuit, the at least one first sub-driving electrode is electrically connected to the first driving circuit, and the at least one first dummy electrode is electrically disconnected with respect to the at least one first sub-driving electrode, and
- wherein the at least one second sub-driving electrode is electrically connected to the second driving circuit, and the at least one second dummy electrode is electrically disconnected with respect to the at least one second sub-driving electrode.

22. The electronic apparatus of claim 20, wherein the at least two first sub-pad electrodes are electrically connected to the at least one first sub-driving electrode and the at least one first dummy electrode, and the at least two second sub-pad electrodes are electrically connected to the at least one second sub-driving electrode and the at least one second dummy electrode.

23. The electronic apparatus of claim 9, wherein the at least one electronic device comprises a first conductive semiconductor layer, an active layer provided on the first conductive semiconductor layer, a second conductive semiconductor layer provided on the active layer, and the plurality of pad electrodes provided on the second conductive semiconductor layer.

24. The electronic apparatus of claim 9, wherein the at least one electronic device comprises a first conductive semiconductor layer, an active layer provided on the first conductive semiconductor layer, a second conductive semiconductor layer provided on the active layer, a thin-film transistor layer provided on the second conductive semiconductor layer, and a light-emitting diode including the plurality of pad electrodes and provided on the thin-film transistor layer.

25. A method of manufacturing an electronic apparatus, the method comprising:
- preparing a first substrate having a first upper surface in which a plurality of grooves are formed;
- supplying a plurality of light-emitting devices on the first upper surface of the first substrate;
- aligning the plurality of light-emitting devices in the plurality of grooves;
- preparing a second substrate comprising a second upper surface having a plurality of driving electrode regions corresponding to the plurality of grooves of the first substrate, a plurality of driving electrodes symmetrically arranged on the plurality of driving electrode regions of the second upper surface, and a driving circuit electrically connected to at least one of the plurality of driving electrodes;
- arranging the first substrate and the second substrate such that the plurality of grooves of the first substrate and the plurality of driving electrode regions of the second substrate face each other; and
- bonding the plurality of light-emitting devices aligned in the plurality of grooves and the plurality of driving electrodes,
- wherein each of the plurality of light-emitting devices comprises a plurality of pad electrodes each comprising a first surface and a second surface facing each other, the plurality of pad electrodes being symmetrically arranged to correspond to the plurality of driving electrodes on the first surface facing each of the plurality of driving electrode regions, respectively, and
- wherein the plurality of driving electrodes comprise at least one dummy electrode that is not connected to the driving circuit.

26. The method of claim 25, wherein the aligning the plurality of light-emitting devices in the plurality of grooves comprises aligning the plurality of light-emitting devices in the plurality of grooves such that the plurality of pad electrodes of the plurality of light-emitting devices face upper openings of the plurality of grooves.

* * * * *